(12) United States Patent
Matsuo et al.

(10) Patent No.: US 8,218,017 B2
(45) Date of Patent: Jul. 10, 2012

(54) IMAGE PICKUP APPARATUS AND CAMERA

(75) Inventors: Keigo Matsuo, Akiruno (JP); Hisashi Goto, Tokyo (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 12/932,977

(22) Filed: Mar. 9, 2011

(65) Prior Publication Data
US 2011/0228147 A1 Sep. 22, 2011

(30) Foreign Application Priority Data
Mar. 17, 2010 (JP) .................. 2010-060850

(51) Int. Cl.
*H04N 5/228* (2006.01)
*H04N 3/14* (2006.01)
(52) U.S. Cl. .............. 348/208.12; 348/273; 348/345
(58) Field of Classification Search ............ 348/208.12, 348/326, 345, 270, 273
See application file for complete search history.

(56) References Cited

U.S. PATENT DOCUMENTS

| 7,715,703 B2 * | 5/2010 | Utagawa et al. ............. 396/111 |
| 8,049,813 B1 * | 11/2011 | Huang et al. ................ 348/349 |
| 2004/0125230 A1 * | 7/2004 | Suda ............................. 348/345 |
| 2009/0167927 A1 * | 7/2009 | Kusaka ......................... 348/345 |
| 2009/0278966 A1 * | 11/2009 | Kusaka ......................... 348/294 |

FOREIGN PATENT DOCUMENTS

| JP | 2007-282109 | 10/2007 |
| JP | 2008-040087 | 2/2008 |

* cited by examiner

*Primary Examiner* — Hung Lam
(74) *Attorney, Agent, or Firm* — Kenyon & Kenyon LLP

(57) ABSTRACT

At least some of the pixels on which color filters that give the largest weight to a brightness signal or color filters that have the highest transmittance among the plurality of color filters are provided are pixels for focus detection that are designed in such a way that the direction of incidence of light beams incident thereon is restricted, the pixels other than the pixels for focus detection are pixels for image picking-up that are designed in such a way that the degree of restriction placed on light beams incident thereon is smaller than that placed on light beams incident on the pixels for focus detection, the pixels for focus detection output at least a signal for ranging, the pixels for image picking-up output at least a signal for an image, and there are at least three pixels for focus detection in an area defined between a circle having its center at the center of any one of the pixels for focus detection and having a radius equal to 3.1 times the pixel pitch and a circle having its center at the center of the aforementioned any one of the pixels for focus detection and having a radius equal to 5.9 times the pixel pitch.

10 Claims, 18 Drawing Sheets

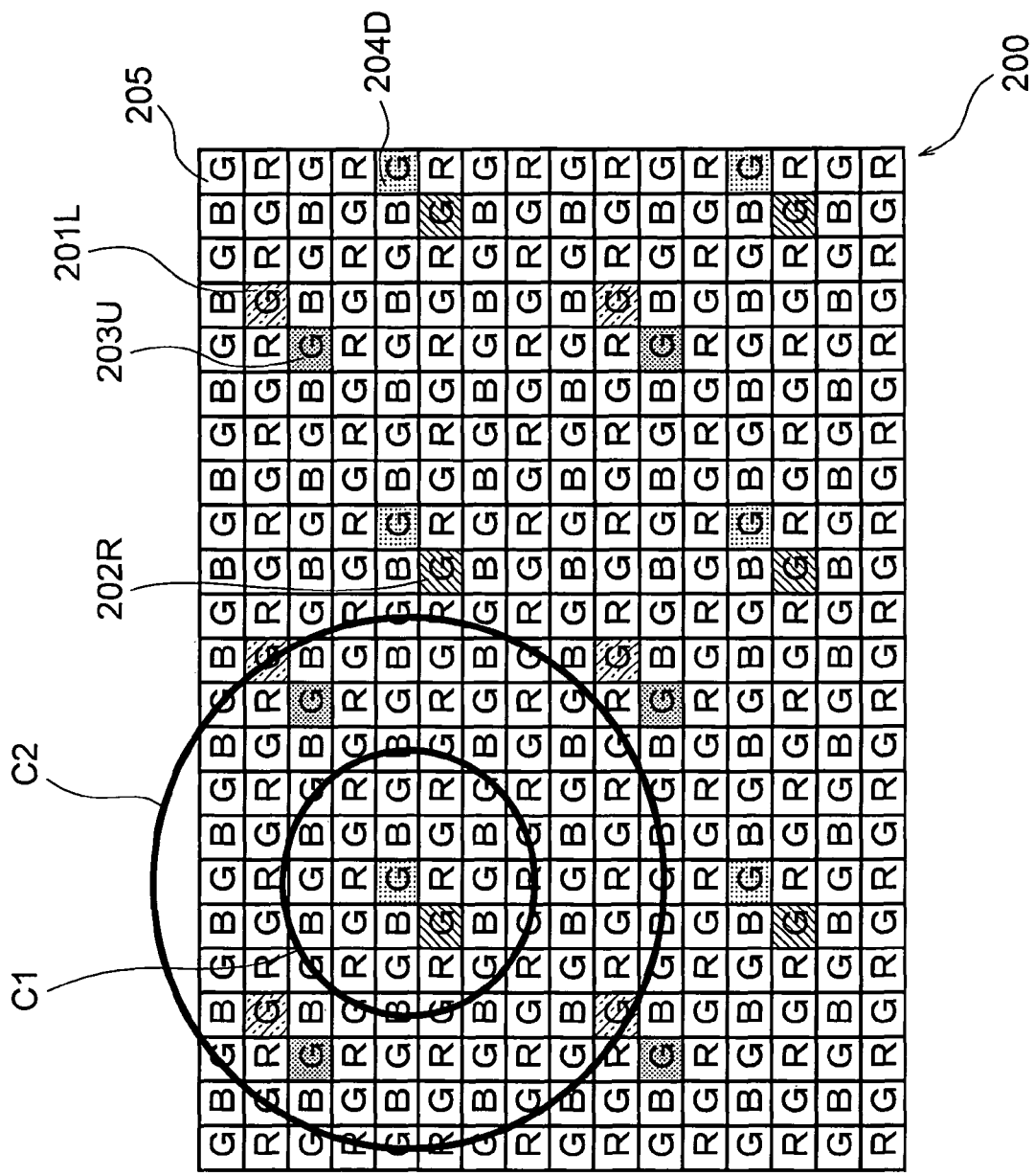

IMAGE PICKUP APPARATUS AND CAMERA

CROSS-REFERENCE TO RELATED APPLICATION

The present application is based upon and claims the benefit of priority from the prior Japanese Patent Application No. 2010-060850 filed on Mar. 17, 2010; the entire contents of which are incorporated herein by reference.

BACKGROUND OF THE INVENTION

1. Field of the Invention

The present invention relates to an image pickup apparatus and a camera.

2. Description of the Related Art

There have been developed image pickup apparatuses that use an image pickup element having pixels used for image picking-up and pixels used for focus detection arranged mixed manner in pixel rows extending in a predetermined direction (see, for example, Japanese Patent Application Laid-Open No. 2007-282109 and Japanese Patent Application Laid-Open No. 2008-40087). In these prior art image pickup apparatuses, the pixels for focus detection are arranged densely in pixel rows of the image pickup element in which pixels for image picking-up having a sensitivity to blue and pixels for image picking-up having a sensitivity to green are arranged one-dimensionally.

SUMMARY OF THE INVENTION

An image pickup apparatus according to the present invention comprises a plurality of pixels each having a photoelectric converter that converts an optical image formed by an image pickup optical system into an electrical signal, a plurality of color filters provided on the plurality of pixels respectively, and an image pickup element in which the plurality of pixels are arranged two-dimensionally, wherein at least some of the pixels on which color filters that give the largest weight to a brightness signal or color filters that have the highest transmittance among the plurality of color filters are provided are pixels for focus detection that are designed in such a way that the direction of incidence of light beams incident thereon is restricted, the pixels other than the pixels for focus detection are pixels for image picking-up that are designed in such a way that the degree of restriction placed on light beams incident thereon is smaller than that placed on light beams incident on the pixels for focus detection, the pixels for focus detection output at least a signal for ranging, the pixels for image picking-up output at least a signal for an image, and there are at least three pixels for focus detection in an area defined between a circle having its center at the center of any one of the pixels for focus detection and having a radius equal to 3.1 times the pixel pitch and a circle having its center at the center of the aforementioned any one of the pixels for focus detection and having a radius equal to 5.9 times the pixel pitch.

BRIEF DESCRIPTION OF THE DRAWINGS

FIG. 18 is a plan view showing the configuration of an image pickup element according to a tenth embodiment.

DETAILED DESCRIPTION OF THE INVENTION

In the following, embodiments of the image pickup apparatus and the camera equipped with the image pickup apparatus according to the present invention will be described in detail. It should be understood that present invention is not limited by the embodiments.

Figure 1:
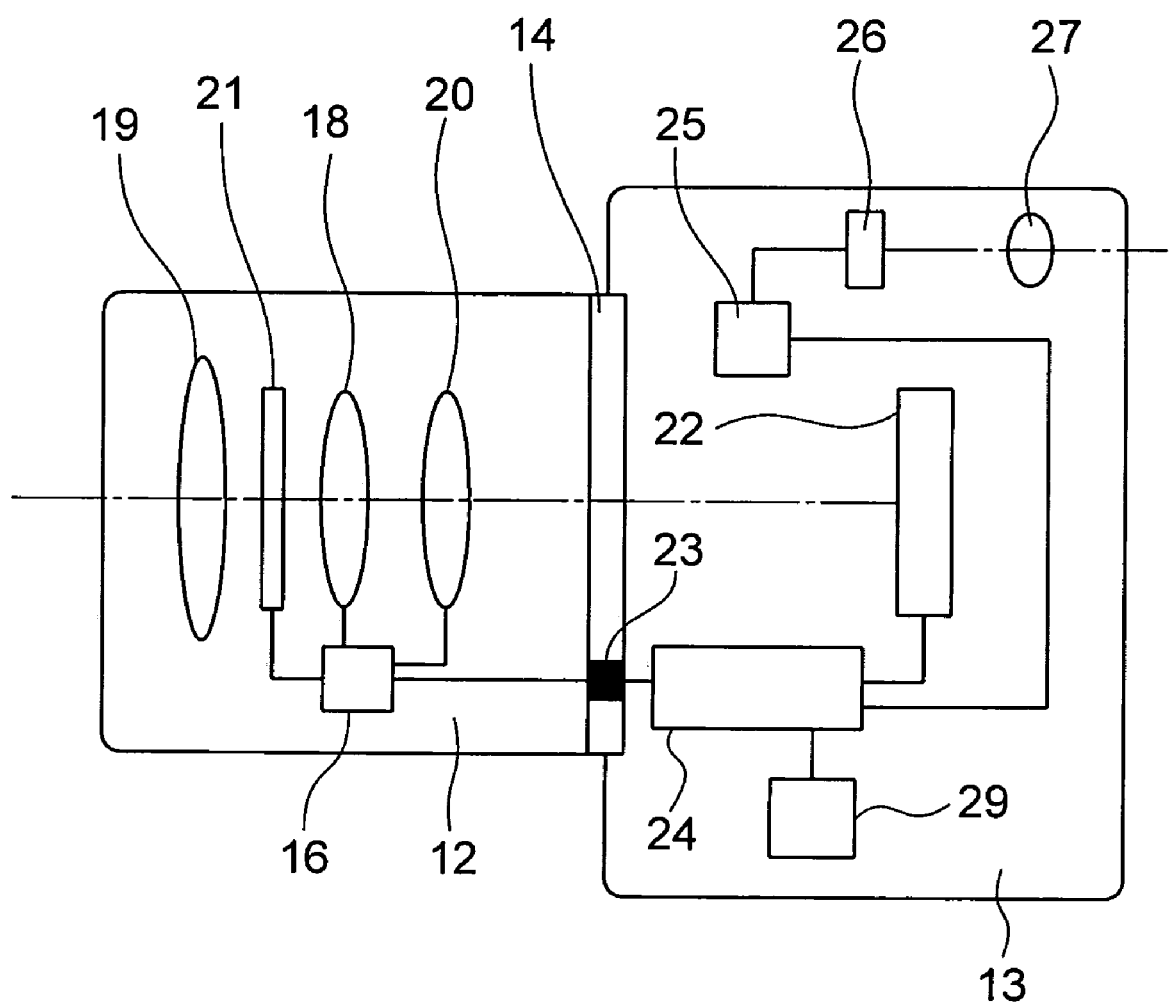
FIG. 1 is a diagram showing the internal structure of a camera according to an embodiment of the present invention.

A camera having the image pickup apparatus according to an embodiment of the present invention will be described. FIG. 1 is a diagram showing the internal structure of a digital still camera 11 according to the embodiment of the present invention.

The digital still camera 11 includes an interchangeable lens 12 and a camera body 13. The interchangeable lens 12 is attached to the camera body 13 by a mounting part 14.

The interchangeable lens 12 includes a lens drive control device 16, a zooming lens 18, a lens 19, a focusing lens 20, and a stop 21. The lens drive control device 16 has a microcomputer and peripheral components such as a memory. The lens drive control device 16 controls driving of the focusing lens 20 and the stop 21, detects the statuses of the stop 21, the zooming lens 18, and the focusing lens 20, sends lens information to a body drive control device 24, and receives camera information from the body drive control device 24.

The camera body 13 has an image pickup element 22, the body drive control device 24, a liquid crystal display element drive circuit 25, a liquid crystal display element 26, an eyepiece lens 27, and a memory card 29. The image pickup element 22 has pixels arranged two dimensionally, as will be described in detail later. The pixels are arranged on the intended imaging plane of the interchangeable lens 12 to pick up an image of an object formed by the interchangeable lens 12. The image pickup element 22 has pixels used for focus detection (which will be hereinafter referred to as "AF pixels") arranged at a predetermined focus detection position.

Here, the interchangeable lens 12 serves as an image pickup optical system, and the image pickup element 22 serves as an image pickup element.

The body drive control device 24 has a microcomputer and peripheral components such as a memory. The body drive control device 24 is adapted to read out an image signal from the image pickup element 22, correct the image signal, detect the focusing state of the interchangeable lens 12, receive lens information from the lens drive control device 16, send camera information (specifically, defocus amount) to the lens drive control device 16, and performs overall control of the operations of the digital still camera. The body drive control device 24 and the lens drive control device 16 communicate with each other through electrical contacts 23 of the mounting part 14 and send/receive various information to/from each other.

The liquid crystal display element drive circuit 25 drives the liquid crystal display element 26 of a liquid crystal viewfinder. A photographer observes an image displayed on the liquid crystal display element 26 through the eyepiece lens 27. The memory card 29 is a portable storage medium detachably attached to the camera body 13. The memory card 29 is used to store image signals.

The image of an object formed on the image pickup element 22 through the interchangeable lens 12 is photoelectrically converted by the image pickup element 22 into electrical signals. The output of the image pickup element 22 is sent to the body drive control device 24. The body drive control device 24 calculates the defocus amount at the predetermined focus detection position based on the output data (which includes a first image signal and a second image signal) obtained from the AF pixels on the image pickup element 22 and outputs the defocus amount to the lens drive control device 16. The body drive control device 24 also stores an image signal created from the output from the image pickup element 22 and sends the image signal to the liquid crystal display element drive circuit 25 to display an image on the liquid crystal display element 26.

The camera body 13 has operation members (e.g. a shutter release button and a setting member for setting the focus detection position etc.) that are not shown in the drawings. The body drive control device 24 detects the operation status signals from the operation members and controls the operations (picking up an image, setting the focus detection position, and processing of image) in accordance with the detection results.

The lens drive control device 16 changes lens information based on the focusing state, the zooming state, the stop set state, and the full aperture F-number. Specifically, the lens drive control device 16 monitors the positions of the lens 18 and the focusing lens 20 and the stop position (or f-stop value) of the stop 21, obtains lens information by computation based on the information thus monitored, and selects lens information corresponding to the monitored information from a look-up table prepared in advance. The lens drive control device 16 calculates a drive amount of the lens based on a received defocus amount and drives the focusing lens 20 to an appropriate position that brings the lens in-focus by a driving unit such as a motor (not shown) based on the drive amount of the lens.

Figure 2A:
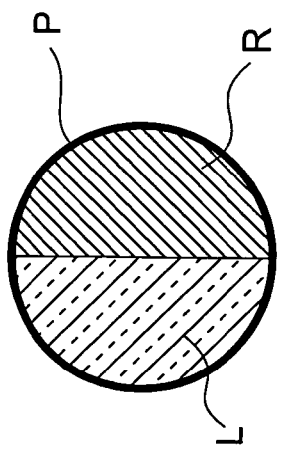
FIGS. 2A to 2E are diagrams showing arrangements of the exit pupil of a camera and an image pickup apparatus according to the embodiment of the present invention.
Figure 2B:
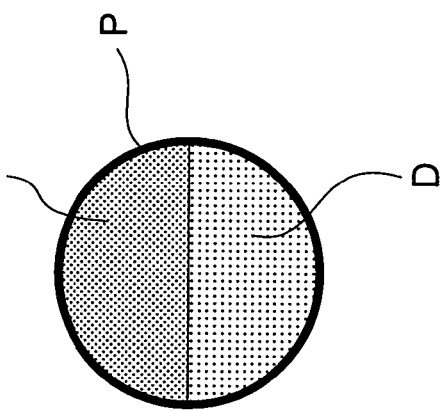
Figure 2C:
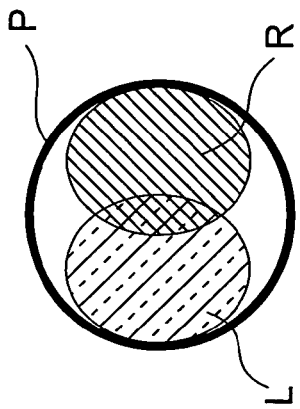
Figure 2D:
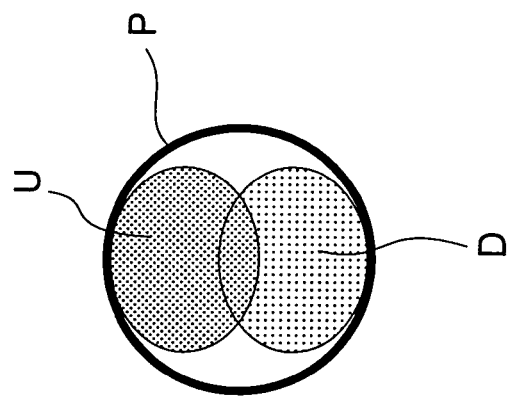
Figure 2E:
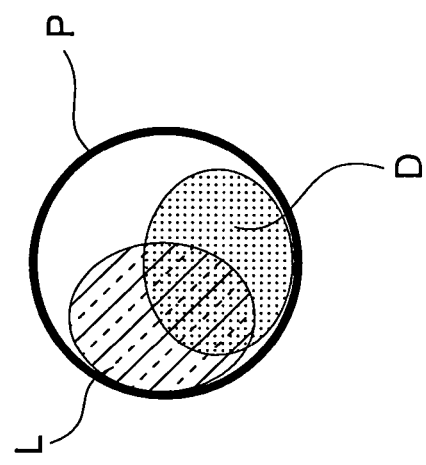
Figure 2F:
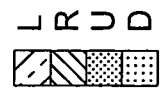
FIG. 2F is a diagram showing the correspondence between the hatching patterns shown in FIGS. 2A to 2E and pixel areas.

FIGS. 2A to 2E are diagrams showing exemplary arrangements of the exit pupil of a camera and an image pickup apparatus according to an embodiment of the present invention. FIG. 2F is a diagram showing the correspondence between the hatching patterns shown in FIGS. 2A to 2E and pixel areas. There are four types of pupil detection pixel areas including a left pupil detection pixel area L, a right pupil detection pixel area R, an upper pupil detection pixel area U, and a lower pupil detection pixel area D. In the exit pupil P of the digital still camera 11, there are pixels for focus detection corresponding to at least two areas of the pupil among the left area, the right area, the upper area, and the lower area, as shown in FIGS. 2A to 2E.

Specific examples (1) to (5) of the arrangement of pixels are given below:
(1) an arrangement in which the exit pupil P is divided vertically into two areas, which include a left pupil detection pixel L and a right pupil detection pixels R respectively (FIG. 2A);
(2) an arrangement in which the exit pupil P is divided horizontally into two areas, in which an upper pupil detection pixel U and a lower pupil detection pixel D are arranged respectively (FIG. 2B);
(3) an arrangement having two partly overlapping areas arrange in the left and the right side, in which a left pupil detection pixel L and a right pupil detection pixel R are arranged respectively (FIG. 2C);
(4) an arrangement having two partly overlapping upper and lower areas, in which an upper pupil detection pixel U and a lower pupil detection pixel D are arranged respectively (FIG. 2D); and
(5) an arrangement having two overlapping areas located at arbitrary positions in which a left pupil detection pixel L and an area including a lower pupil detection pixel D are arranged respectively (FIG. 2D).

Although the pupils for ranging shown in FIGS. 2A to 2E have a semicircular shape or an elliptic shape, the shape of the pupils is not limited to them, but they may have other shapes such as a rectangular shape or a polygonal shape.

The arrangements shown in FIGS. 2A and 2B may be used in combination to include left, right, upper and lower focus detection pixels. The arrangements shown in FIGS. 2C and 2D may be used in combination to include left, right, upper and lower focus detection pixels. The arrangements shown in FIGS. 2C and 2E may be used in combination to include left and right focus detection pixels and focus detection pixels for detecting oblique lines. The arrangements of the focus detection pixels are not limited to those described above.

In the camera and the image pickup apparatus according to this embodiment, the pupil includes different areas. A first image signal is obtained from the output of the photo electric converter that receives light beams having passed through one of the areas, and a second image signal is obtained from the output of the photo electric converter that receives light beams having passed through the other of the areas. The focusing state of the taking lens is detected by measuring the phase difference on the basis of these signals.

In the following, specific ways of division of the exit pupil will be described with reference to FIGS. 3 to 6.

Figure 3:
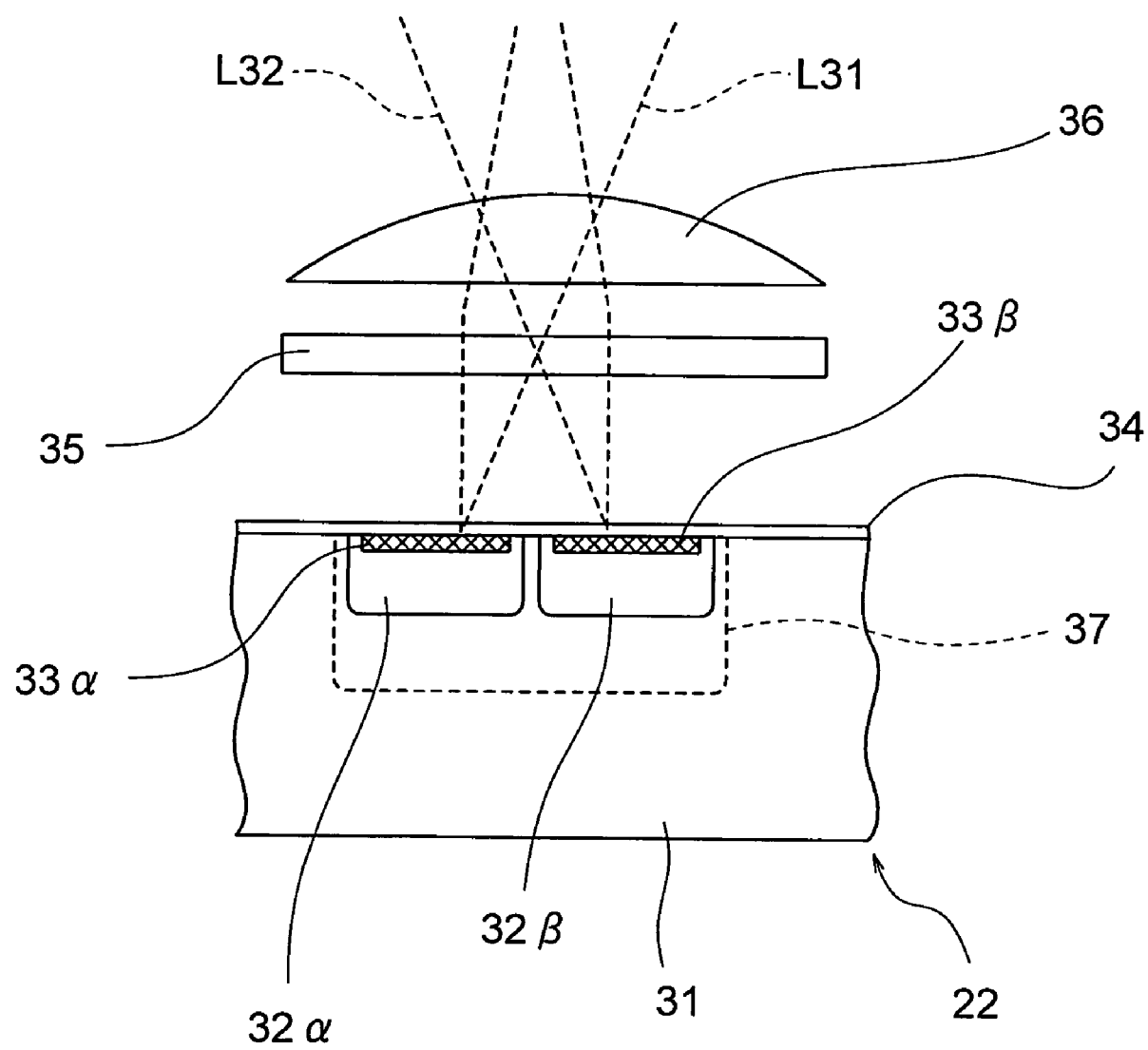
FIG. 3 is a diagram showing the structure of a photoelectric converter of an image pickup element according to an embodiment of the present invention.

First, a case in which division of the exit pupil is achieved by dividing the photoelectric converter of the image pickup element 22 will be described with reference to FIG. 3. FIG. 3 shows the structure of the photoelectric converter of the image pickup element 22.

The image pickup element 22 includes a p-type well 31 provided in a substrate and n-type regions 32α, 32β in which photo-induced charge is generated and accumulated in cooperation with the p-type well, and a floating diffusion region (which will be hereinafter referred to as "FD region") that is not shown in FIG. 3 and to which the photo-induced charge accumulated in the n-type regions 32α, 32β is transferred, surface p+ layers 33α, 33β that collect the photo-induced charge accumulated in the n-type regions 32α, 32β to efficiently transfer the photo-induced charge to the FD region, a transfer gate (not shown) through which the photo-induced charge is transferred to the FD region, an $SiO_2$ film 34 for insulating the gate, a color filter 35 of Bayer arrangement, and a micro lens 36 for collecting light coming from an object.

The micro lens 36 is shaped and located in such a way as to make the pupil of the lens 19 (FIG. 1) and the surface p+ layers 33α and 33β conjugate with each other. The photo-induced charge is generated in an area 37 schematically shown in FIG. 3.

In the case shown in FIG. 3, the photoelectric converter is divided into two sections, one including the n-type regions 32α and the surface p+ layers 33α, and the other including the n-type regions 32β and the surface p+ layers 33β, thereby dividing the exit pupil. Light beams L31 and light beams L32 are incident on the area including the n-type region 32α and surface p+ layer 33α and the area including the n-type region 32β and the surface p+ layer 33β respectively.

Figure 4:
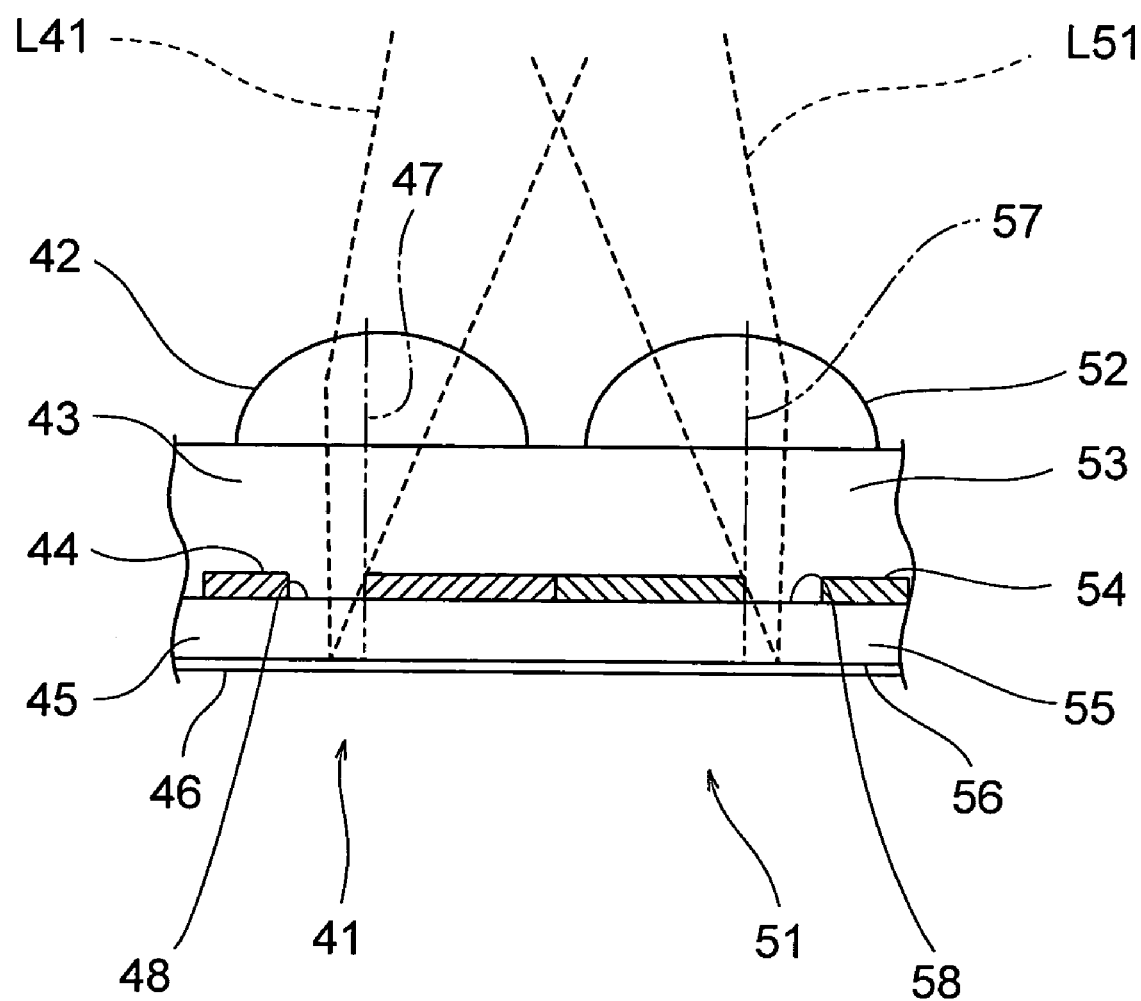
FIG. 4 is a cross-sectional view showing the structure of two adjacent pixels of an image pickup element according to an embodiment of the present invention.

Next, a case in which division of the exit pupil is achieved by offsetting the openings of pixels of the image pickup element 22 from the centers of photoelectric conversion elements will be described with reference to FIG. 4. FIG. 4 is a cross-sectional view showing the structure of two adjacent pixels of the image pickup element 22.

A pixel 41 has, in order from the top, a micro lens 42, a smooth layer 43 that provides a flat surface on which the micro lens 42 is formed, a light blocking film 44 for preventing color mixture between color pixels, a smooth layer 45 for smoothing a surface on which a color filter layer is provided, and a photoelectric conversion element 46. Another pixel 51 also has, in order from the top, a micro lens 52, a smooth layer 53, a light blocking film 54, a smooth layer 55, and a photoelectric conversion element 56, as with the pixels 41.

In the pixels 41 and 51, the light blocking films 44 and 54 have openings 48 and 58 that are offset outwardly from the centers 47 and 57 of the photoelectric conversion elements 46 and 56 respectively.

In the case shown in FIG. 4, the openings of the pixels of the image pickup element 22 are offset from the centers of the photoelectric conversion elements. Therefore, light beams L41 and light beams L51 are incident on the photoelectric conversion elements 46 and 56 respectively. Thus, division of the exit pupil is achieved.

Figure 5:
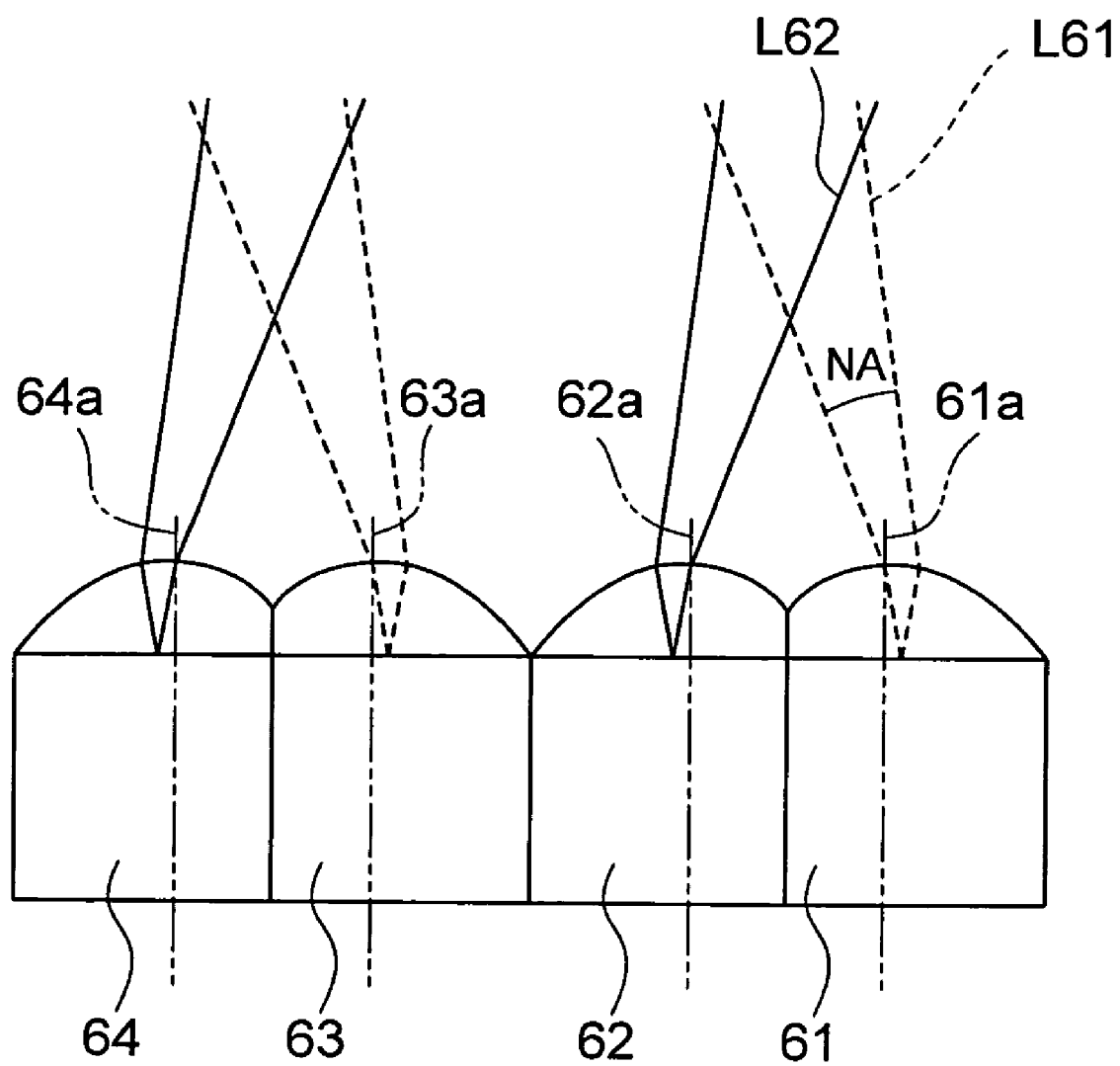
FIG. 5 is a diagram showing the internal structure of an image pickup element according to an embodiment of the present invention.

Next, a case in which division of the exit pupil is achieved by offsetting or decentering lenses will be described with reference to FIG. 5. FIG. 5 shows the internal structure of image pickup elements.

In the image pickup element shown in FIG. 5, on-chip lenses 61, 62, 63, and 64 on the respective pixels are independent from each other.

In FIG. 5, the optical axes 61a and 63a of the on-chip lenses 61 and 63 in a pixel group A are offset to the left from centers of the pixels. The optical axes 62a and 64a of the on-chip lenses 62 and 64 in a pixel group B are offset to the right from the centers of the pixels.

The focus amount of the lens 18 can be calculated by comparing the outputs from the two pixel groups A and B.

The on-chip lenses 61, 62, 63, and 64 have two independently controllable parameters, namely their refracting power and their shape (e.g. the position of the optical axis 61a, 62a, 63a, 64a). If the number of pixels are sufficiently large, the pixel group A and the pixel group B can have light intensity distributions similar to each other. Then, phase difference AF can be performed utilizing them. In this case, since the defocus amount can be detected in the entire area of the picture frame, three-dimensional information of the object can be obtained.

In the case shown in FIG. 5, the on-chip lenses of the image pickup element 22 are offset from the centers of the respective pixels. Therefore, light beams L61 and light beams L62 are incident on the on-chip lenses 61 and 62 respectively. Thus, division of the pupil is achieved.

Figure 6:
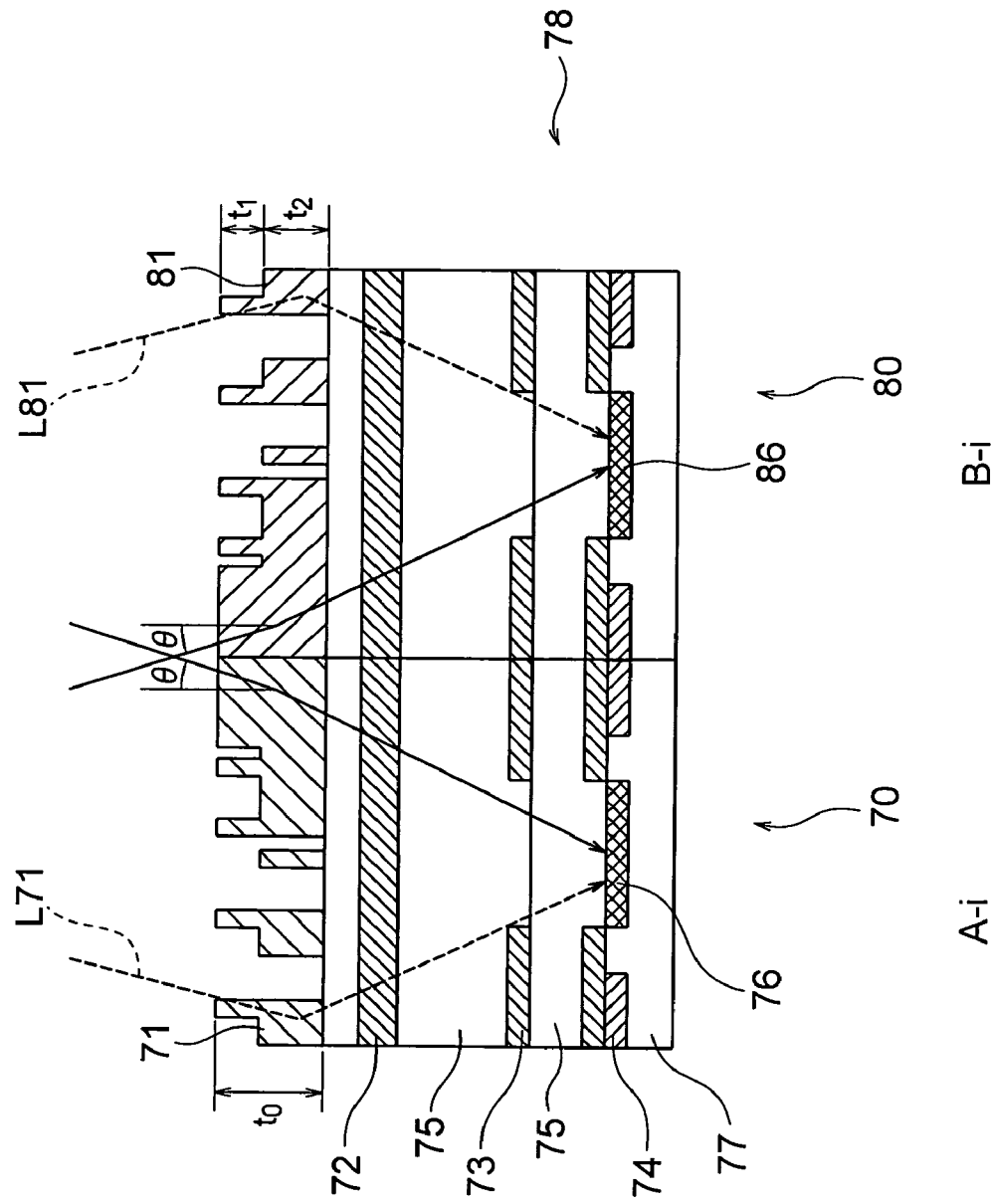
FIG. 6 is a diagram showing the internal structure of an image pickup element according to an embodiment of the present invention.

Next, a case in which digital micro lenses are used to divide the exit pupil will be described with reference to FIG. 6. FIG. 6 is a cross sectional view showing the internal structure of an image pickup element.

In the image pickup element shown in FIG. 6, gradient index lenses are used as the on-chip lenses. Pixel 70 and pixel 80 are adjacent pixels that receive light beams from different regions.

The image pickup element shown in FIG. 6 has gradient index lenses 71, 81 serving as DMLs, a color filter 72, aluminum wiring 73, a signal transmission part 74, a smooth layer 75, light-receiving elements (e.g. Si photodiodes) 76, 86, and an Si substrate 77. As shown in FIG. 6, the aluminum wiring 73, the signal transmission part 74, the smooth layer 75, the light receiving elements 76, 86, and the Si substrate 77 constitute a semiconductor integrated circuit 78. The pixel 70 and the pixel 80 have the same structure except for the gradient index lenses 71, 81.

FIG. 6 shows light beams among the entire incident light beams that are incident on the light receiving elements 76 and 86 respectively. With the use of the gradient index lenses 71 and 81, the light beams L71 and light beams L81 are incident on the light receiving element 76 of the pixel 70 and the light receiving element 86 of the pixel 80 respectively. Thus, division of the exit pupil is achieved.

EMBODIMENTS

In the following, first to tenth embodiments of the image pickup element according to this mode will be described with reference to FIGS. 7 to 18.

As the image pickup element (or imager), the use may be made of a CCD (Charge Coupled Device), a CMOS (Complementary Metal Oxide Semiconductor), a back side illuminated CMOS, a sensor (e.g. Forveon X3) that can capture all three colors (red, green, and blue) in one pixel with three layers.

In the following description of the embodiments, the pixels for focus detection are adapted to receive light beams that have transmitted through different positions in the pupil of a taking lens by offsetting the on-chip lenses provided on the taking lens side of the photo electric converter from the centers of the pixels. The pupil may be divided by offsetting openings of a light blocking member from the centers of the pixels, by using DMLs, or by providing two photoelectric converters in one pixel, as described above.

The pixels for focus detection are adapted to receive light beams that have transmitted through different positions in the pupil of the taking lens. Therefore, the signal level of the signal output from a pixel for focus detection can be different from the signal level of the signals output from pixels for image picking-up located in the neighborhood of the pixel for focus detection. It is preferred that a signal for image picking-up at the position of a pixel for focus detection be obtained using one of the following methods (1) and (2):

(1) adjusting the gain for the signal output from the pixel for focus detection to make its signal level substantially equal to the signal level of the signals output from the pixels for image pickup in the neighborhood and employing the signal with thus adjusted gain as the signal for image picking-up at the position of this pixel for focus detection;

(2) executing pixel interpolation based on the signal output from the pixel for focus detection and the signals output from the pixels for image pickup in the neighborhood of the pixel for focus detection and employing the signal thus obtained as the signal for image picking-up at the position of this pixel for focus detection.

The gain may be adjusted in the following way.

First, the signal level of the signal output from the pixel for focus detection and the signal level of the signals output from the pixels for image pickup in the neighborhood of the pixel for focus detection are compared with each other. Then, the gain of the signal output from the pixel for focus detection is adjusted in such a way as to make the signal level of the signal output from the pixel for focus detection close to the signal level of the signal output from the pixels for image pickup in the neighborhood. Then, demosaicing process is executed by taking the signal obtained by adjusting the gain of the signal output from the pixel for focus detection as a signal for image picking-up. Thus, the final image is obtained.

It is preferred that the pixel interpolation be performed according to one of the following methods (a) to (c):

(a) constructing a signal at the position of the pixel for focus detection by interpolation based on the signals output from the pixels for image pickup in the neighborhood of the pixel for focus detection, and performing demosaicing using the signal constructed by interpolation as the signal for image picking-up at the position of the pixel for focus detection to obtain the final image;

(b) constructing a signal at the position of the pixel for focus detection by interpolation based on the signal output from the pixel for focus detection and the signals output from the pixels for image pickup in the neighborhood of the pixel for focus detection, and performing demosaicing using the signal constructed by interpolation as the signal for image picking-up at the position of the pixel for focus detection to obtain the final image;

(c) constructing a signal at the position of the pixel for focus detection by interpolation based on the signals output from the pixels for image pickup in the neighborhood of the pixel for focus detection, constructing another signal by interpolation based on the signal constructed by the above interpolation and the signal at the position of the pixel for focus detection, and performing demosaicing using this another signal constructed by interpolation as the signal for image picking-up at the position of the pixel for focus detection to obtain the final image.

It is preferred that one of these methods (a) to (c) be employed, but the method of pixel interpolation is not limited to them. Pixel interpolation may be performed by simple averaging (including weighted averaging), linear interpolation, interpolation using quadratic or higher polynomial equation, or median calculation.

A plurality of color filters are provided for the plurality of pixels of the image pickup element. In the first to tenth embodiments, three types of color filters having different transmission characteristics are used, namely, R (red) filters, G (green) filters, and B (blue) filters.

The B filter has a transmission characteristic that transmits light of shortest wavelengths among the R, G, and B filters. The R filter has a transmission characteristic that transmits light of longest wavelengths. The G filter has a transmission characteristic that transmits light of intermediate wavelengths.

Other combinations of the types of color filters may be adopted on condition that at least three types of color filters that transmit light in at least a portion of the visible wavelength range and have different transmission characteristics are included.

For the pixels for focus detection, G filters are used as color filters that give the largest weight to the brightness signal among the plurality of color filters to restrict the direction of incidence of the incident light.

The color filters provided for the pixels for focus detection are not limited to the G filters. The direction of incidence of light beams incident on at least some of the pixels for which filters that give the largest weight to the brightness signal among the plurality of color filters or the color filters having the highest transmittance among the plurality of color filters are provided may be restricted so that the aforementioned at least some of the pixels serve as the pixels for focus detection.

It is preferred that the pixels for focus detection be arranged only in Gb channels or only in Gr channels. In the context of this specification, the Gb channels refer to rows in FIGS. 7, 9, and 11 to 18 in which squares "G" and "B" (representing pixels with G filters and B filters) are arranged alternately, and the Gr channels refer to rows in which squares "G" and "R" (representing pixels with G filters and R filters) are arranged alternately.

There is a difference in the signal level between a signal output from a Gb channel and a signal output from a Gr channel. Therefore, if one of a pair of pixels for pupil detection is arranged in a Gb channel and the other is arranged in a Gr channel, the focus detection performance will be deteriorated. Therefore, it is preferred that a pair of pixels for pupil detection be arranged only in a Gb channel(s) or only in a Gr channel(s).

Figure 7:
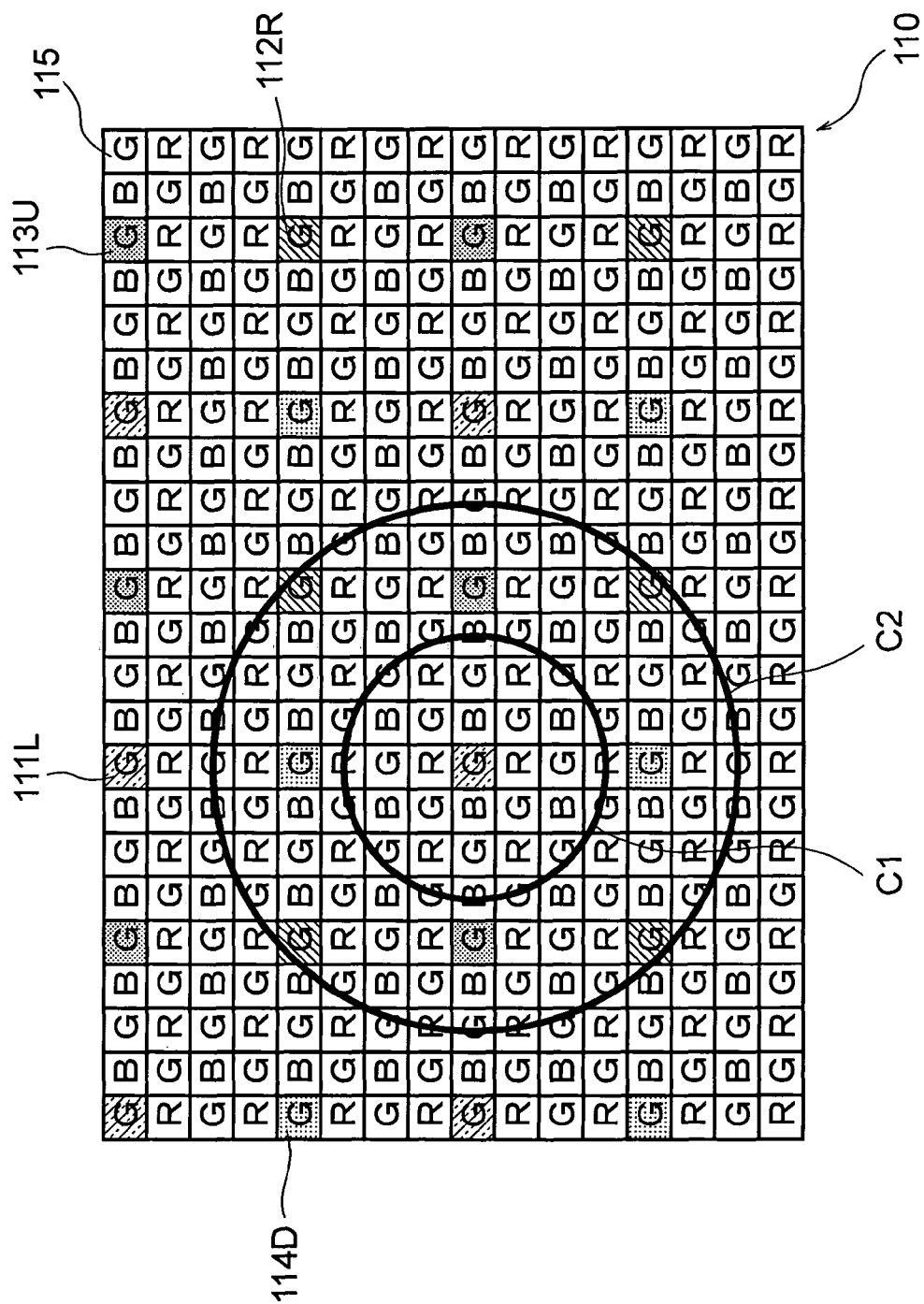
FIG. 7 is a plan view showing the configuration of an image pickup element according to a first embodiment.

FIG. 7 is a plan view showing the configuration of an image pickup element according to the first embodiment.

In FIGS. 7, 9, and 11 to 18 that show configurations of embodiments, pixels for focus detection are simply indicated by hatching applied to the entire area of the corresponding pixels, which is not intended to illustrate the actual configuration of the pixels.

The image pickup element 110 according to the first embodiment has pixels for image picking-up 115 and pixels for focus detection including left pupil detection pixels 111L, right pupil detection pixels 112R, upper pupil detection pixels 113U, and lower pupil detection pixels 114D.

In the image pickup element 110, the left pupil detection pixels 111L and the upper pupil detection pixels 113U are arranged alternately in the same rows or the same Gb channels. The right pupil detection pixels 112R and the lower pupil detection pixels 114D are arranged alternately in the second next Gb channels (i.e. in the Gb channels arranged below the aforementioned GB channels in which the left pupil detection pixels 111L and the upper pupil detection pixels 113U are arranged with one GB channel between). The left pupil detection pixels 111L and the lower pupil detection pixels 114D are arranged in the same columns, and the upper pupil detection pixels 113U and the right pupil detection pixels 112R are arranged in columns different from the columns in which the left pupil detection pixels 111L and the lower pupil detection pixels 114D are arranged. In this arrangement, the pupil detection pixels are arranged with three pixels for image picking-up 115 intervening between in both the rows and the columns.

In the first to tenth embodiments, the Gb channels and the Gr channels are arranged as alternating rows.

Figure 8:
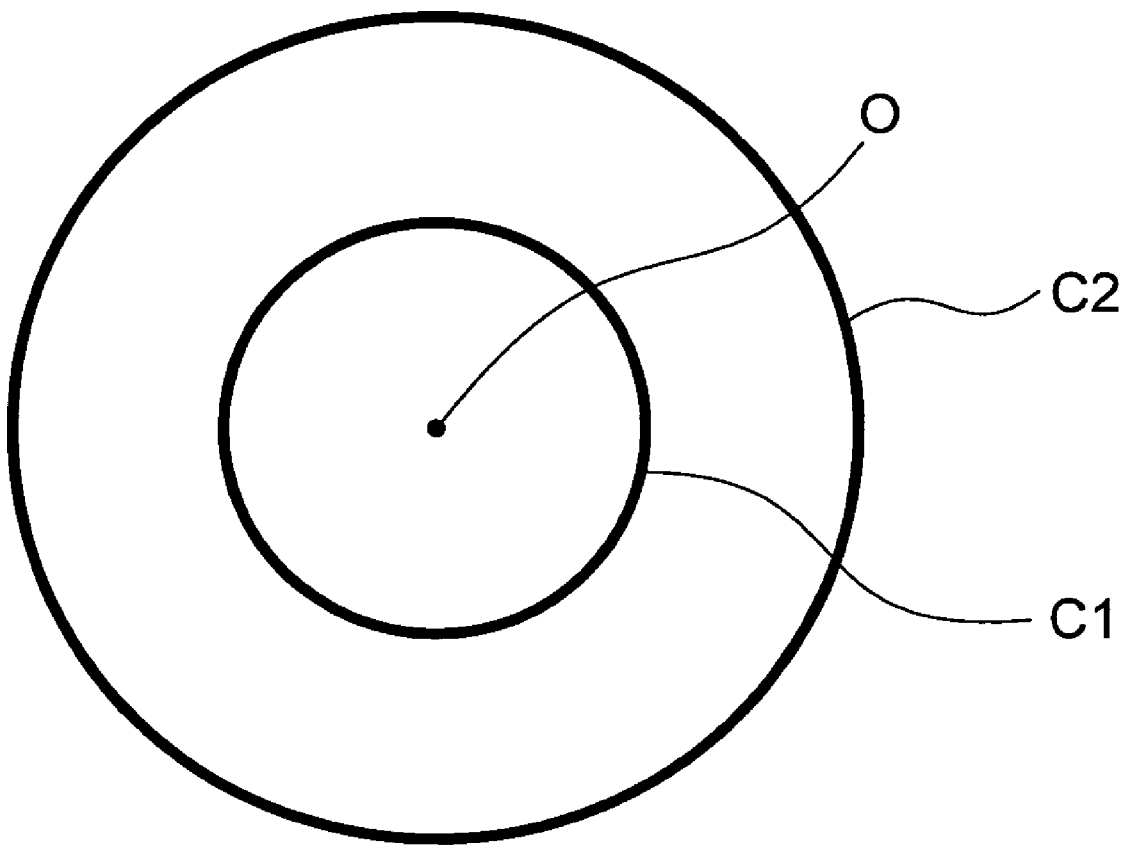
FIG. 8 is a diagram showing two concentric circles defining a pixel area.

FIG. 8 shows two concentric circles defining a pixel area. The inner first circle C1 has its center at point O and has a radius equal to 3.1 times the pixel pitch of the image pickup element. The second circle C2 outside the first circle C1 has its center at point O and has a radius equal to 5.9 times the pixel pitch of the image pickup element.

Thus, a high arrangement density of the pixels for focus detection can be achieved, and a constant number of pixels for image picking-up can be arranged around the pixels for focus detection. Therefore, good balance between the image quality and the focus detection performance can be achieved.

The two concentric circles shown in FIG. 8 are applied to the image pickup element 110 according to the first embodiment. One left pupil detection pixel 111L is arbitrarily selected, and the center O of the circles is set at the center (the fiducial point) of this pixel. If the circles are thus set, there is only one pixel for focus detection in the first circle C1, that is, the left pupil detection pixel 111L at the center. There are eight pixels for focus detection in the area defined between the first circle C1 and the second circle C2. Here, a determination as to whether or not a pixel for focus detection is said to fall within the pixel area is made based on whether the center of that pixel falls within the pixel area.

Figure 9:
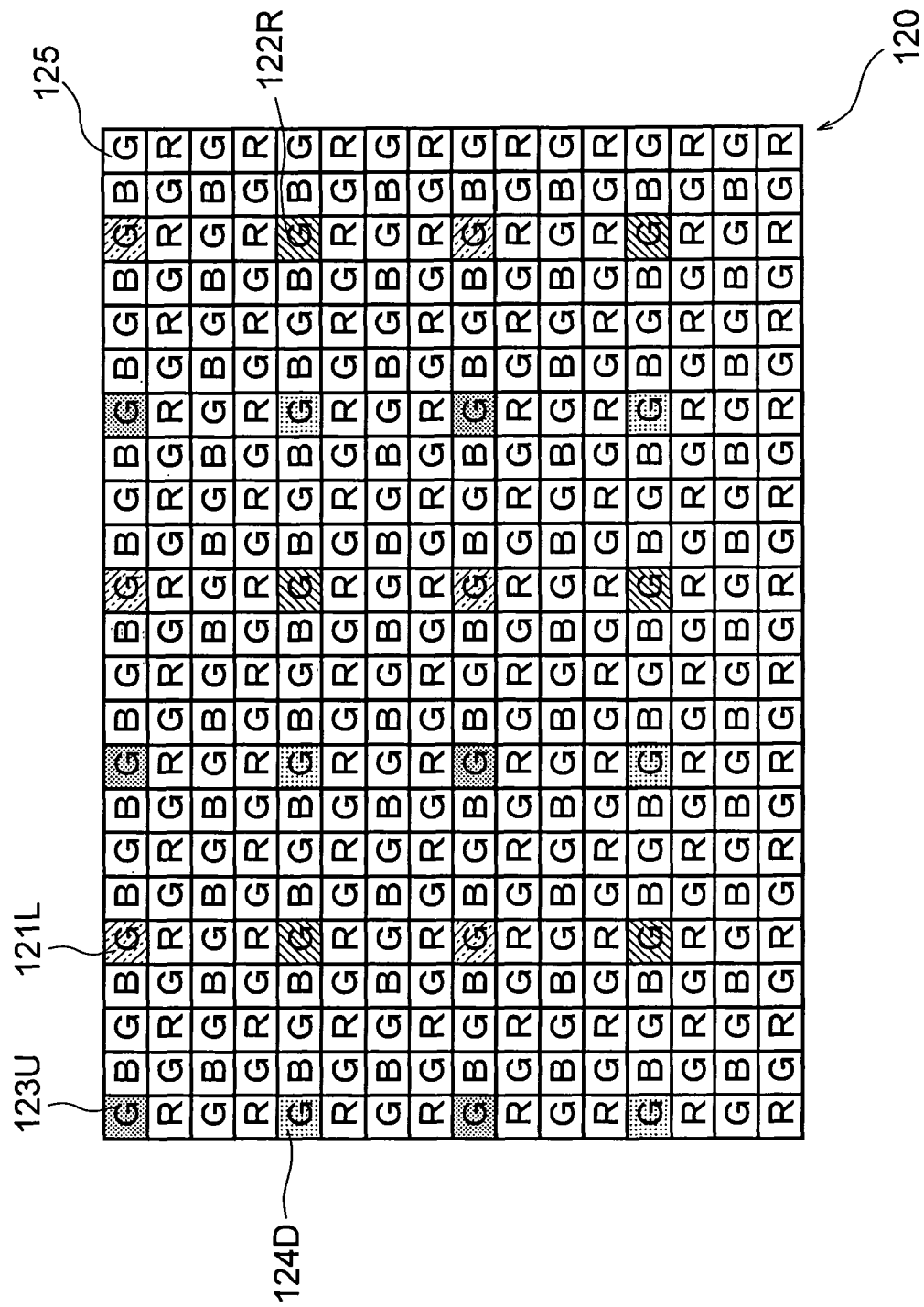
FIG. 9 is a plan view showing the configuration of an image pickup element according to a second embodiment.

FIG. 9 is a plan view showing the configuration of an image pickup element according to the second embodiment.

The image pickup element 120 according to the second embodiment has pixels for image picking-up 125 and pixels for focus detection including left pupil detection pixels 121L, right pupil detection pixels 122R, upper pupil detection pixels 123U, and lower pupil detection pixels 124D.

In the image pickup element 120, the left pupil detection pixels 121L and the upper pupil detection pixels 123U are arranged alternately in the same rows or the same Gb channels. The right pupil detection pixels 122R and the lower pupil detection pixels 124D are arranged alternately in the second next Gb channel.

The pupil detection pixels are arranged with three pixels for image picking-up 115 intervening between in both the rows and the columns, as with the first embodiment. Thus, there are eight pixels for focus detection in the area defined between the first circle C1 and the second circle C2, though the circles C1 and C2 are not shown in FIG. 9. Therefore, good balance between the image quality and the focus detection performance can be achieved.

The left pupil detection pixels 121L and the right pupil detection pixels 122R are arranged alternately in the same columns, and the upper pupil detection pixels 123U and the lower pupil detection pixels 124D are arranged alternately in columns different from the columns in which the left pupil detection pixels 121L and the right pupil detection pixels 122R are arranged. Since the left pupil detection pixels 121L and the right pupil detection pixels 122R are arranged in the same columns, a misregistration in the detection along the vertical direction of an object can be prevented.

Figure 10:
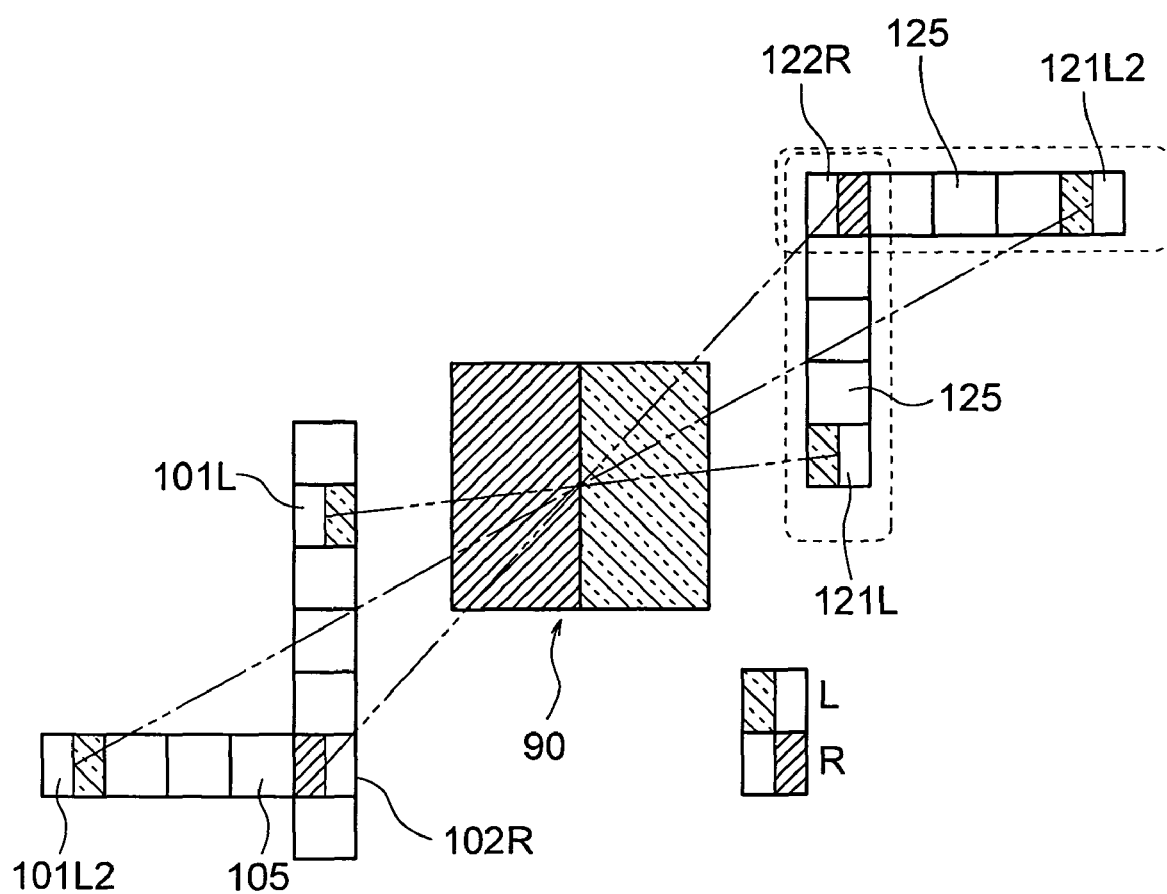
FIG. 10 is a diagram showing an exemplary arrangement of a left focus detection pixel and a right focus detection pixel.

FIG. 10 shows an exemplary arrangement of a left focus detection pixel and a right focus detection pixel according to the second embodiment.

In the image plane side part of FIG. 10 (or on the right side of a pupil 90), a left pupil detection pixel 121L and a right pupil detection pixel 122R are arranged in the same column with three pixels for image picking-up 125 intervening between. In addition, an arrangement in which a left pupil detection pixel 121L2 is arranged in the same row as the right pupil detection pixel 122R is also shown in FIG. 10 as a comparative example. On the other hand, in the object side part of FIG. 10 (or on the left side of the pupil 90), there are shown projections 105, 101L, 101L2, 102R of the pixels for image picking-up 125, the left pupil detection pixels 121L, 121L2, and the right pupil detection pixel 122R on the object respectively.

In the case of the pixel projections 101L and 102R in FIG. 10, since the left pupil detection pixel 121L and the right pupil detection pixel 122R are arranged in the same column, the phase difference with respect to the vertical direction of the object can be measured more accurately than in the case in which the left pupil detection pixel 121L and the right pupil detection pixel 122R are arranged in the same row as is the case with the comparative example. Thus, an improvement in the phase difference detection performance can be achieved.

Figure 11:
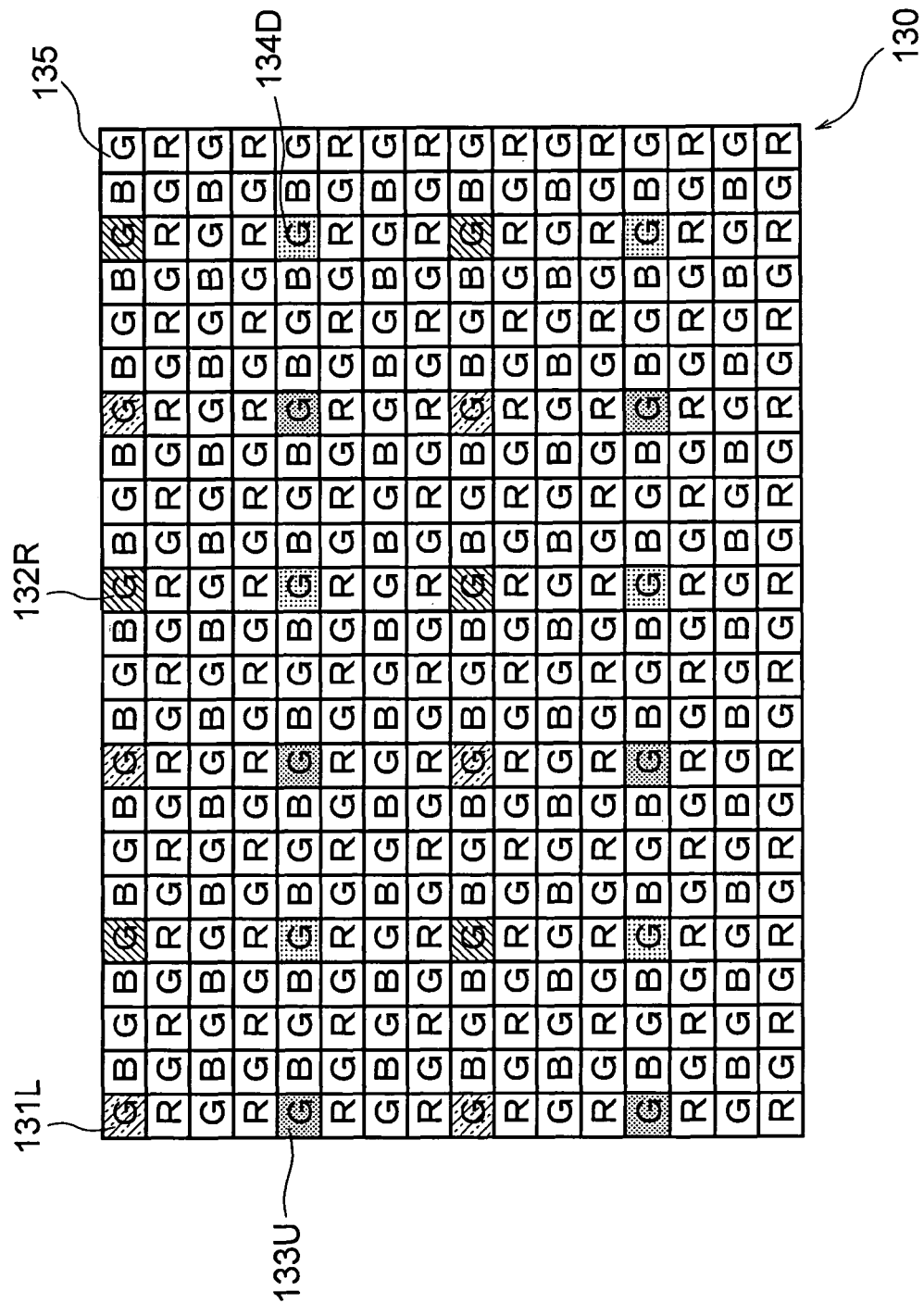
FIG. 11 is a plan view showing the configuration of an image pickup element according to a third embodiment.

FIG. 11 is a plan view showing the configuration of an image pickup element according to the third embodiment.

The image pickup element 130 according to the third embodiment has pixels for image picking-up 135 and pixels for focus detection including left pupil detection pixels 131L, right pupil detection pixels 132R, upper pupil detection pixels 133U, and lower pupil detection pixels 134D.

In the image pickup element 130, the left pupil detection pixels 131L and the right pupil detection pixels 132R are arranged alternately in the same rows or the same Gb channels. The upper pupil detection pixels 133U and the lower pupil detection pixels 134D are arranged in order in the second next Gb channels. Therefore, since the upper pupil detection pixels 133U and the lower pupil detection pixels 134D are arranged in the same rows, a misregistration in the detection along the horizontal direction of an object can be prevented.

On the other hand, the left pupil detection pixels 131L and the upper pupil detection pixels 133U are arranged alternately in the same columns, and the right pupil detection pixels 132R and the lower pupil detection pixels 134D are arranged alternately in columns different from the columns in which the left pupil detection pixels 131L and the upper pupil detection pixels 133U are arranged.

The pupil detection pixels are arranged with three pixels for image picking-up 115 intervening between in both the rows and the columns, as with the first embodiment. Thus, there are eight pixels for focus detection in the area defined between the first circle C1 and the second circle C2, though the circles C1 and C2 are not shown in FIG. 11. Therefore, good balance between the image quality and the focus detection performance can be achieved.

Figure 12:
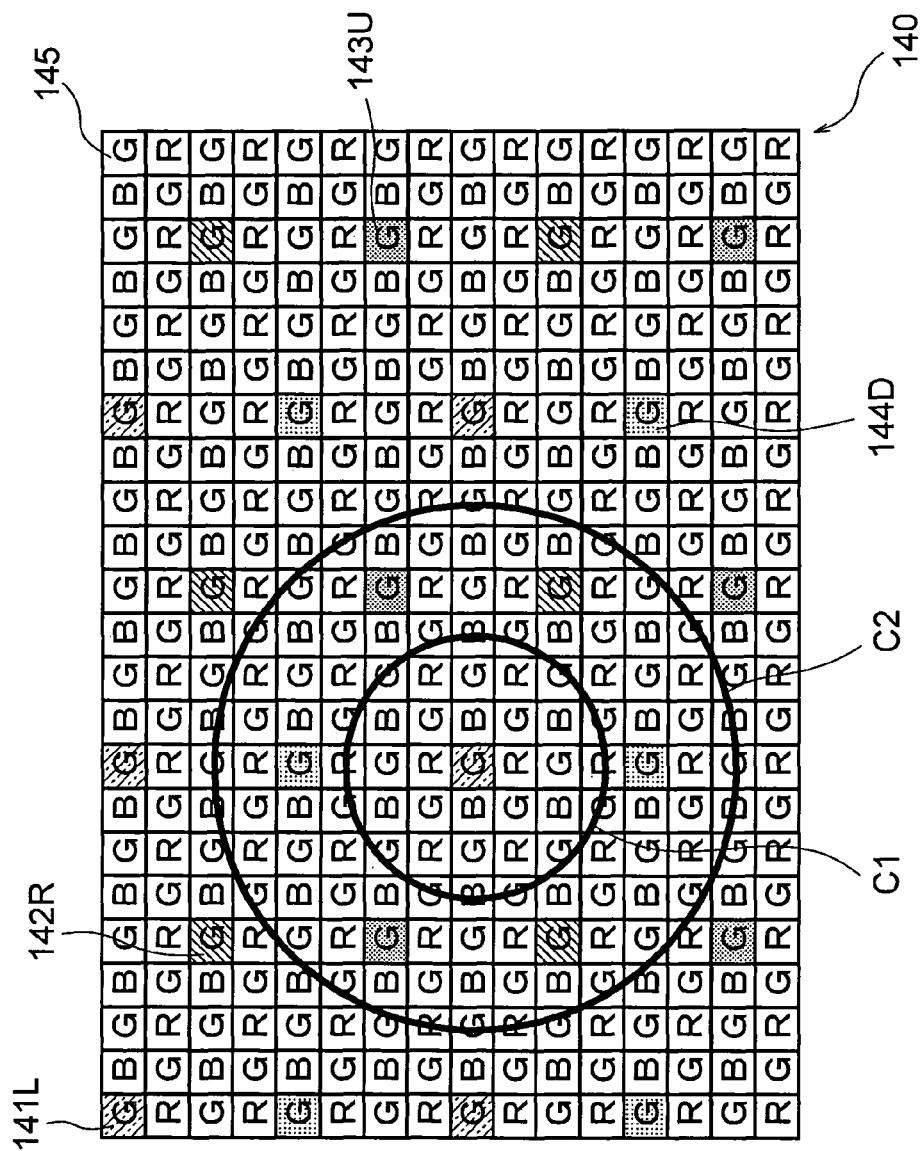
FIG. 12 is a plan view showing the configuration of an image pickup element according to a fourth embodiment.

FIG. 12 is a plan view showing the configuration of an image pickup element according to the fourth embodiment.

The image pickup element 140 according to the fourth embodiment has pixels for image picking-up 145 and pixels for focus detection including left pupil detection pixels 141L, right pupil detection pixels 142R, upper pupil detection pixels 143U, and lower pupil detection pixels 144D.

Different types of pupil detection pixels are arranged regularly with seven pixels for image picking-up 145 intervening between in different Gb channels. Specifically, the left pupil detection pixels 141L, the right pupil detection pixels 142R, the lower pupil detection pixels 144D, and the upper pupil detection pixels 143U are arranged in order in a plurality of Gb channels arranged in order, respectively.

The left pupil detection pixels 141L and the lower pupil detection pixels 144D are arranged alternately in the same columns, and the right pupil detection pixels 142R and the upper pupil detection pixels 143U are arranged alternately in columns different from the columns in which the left pupil detection pixels 141L and the lower pupil detection pixels 144D are arranged.

If the two concentric circles shown in FIG. 8 are applied to FIG. 12, there are six pixels for focus detection in the area defined between the first circle C1 and the second circle C2. Therefore, good balance between the image quality and the focus detection performance can be achieved.

Figure 13:
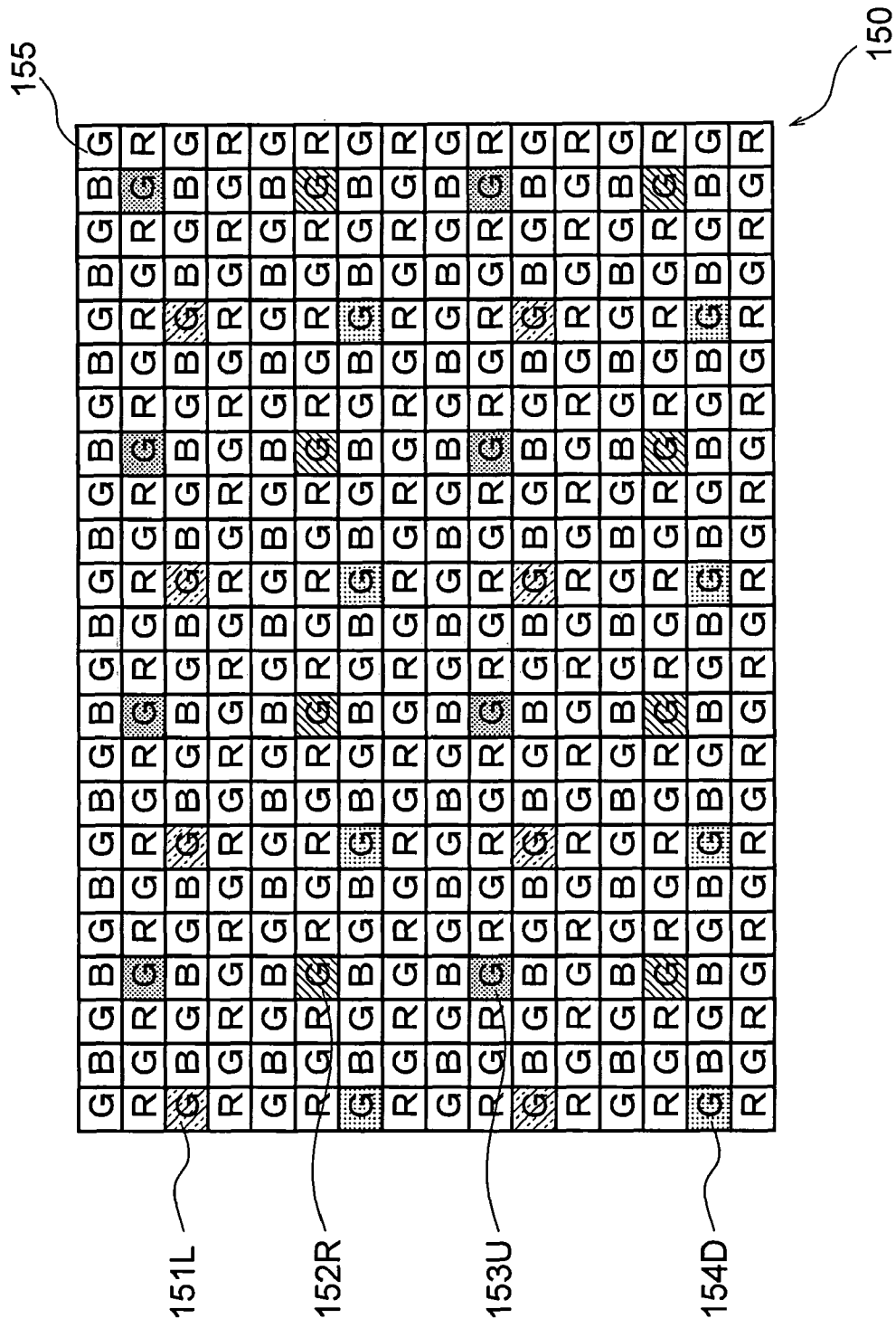
FIG. 13 is a plan view showing the configuration of an image pickup element according to a fifth embodiment.

FIG. 13 is a plan view showing the configuration of an image pickup element according to the fifth embodiment.

The image pickup element 150 according to the fifth embodiment has pixels for image picking-up 155 and pixels for focus detection including left pupil detection pixels 151L, right pupil detection pixels 152R, upper pupil detection pixels 153U, and lower pupil detection pixels 154D.

The left pupil detection pixels 151L are arranged regularly with five pixels for image picking-up 155 intervening between in Gb channels. The lower pupil detection pixels 154D are arranged regularly with five pixels for image picking-up 155 intervening between in the second next Gb channels below the Gb channels in which the left pupil detection pixels 151L are arranged.

The right pupil detection pixels 152R are arranged regularly with five pixels for image picking-up 155 intervening between in Gr channels. The upper pupil detection pixels 153U are arranged regularly with five pixels for image picking-up 155 intervening between in the second next Gr channels below the Gr channels in which the right pupil detection pixels 152R are arranged. The Gb channels in which the lower pupil detection pixels 154D are arranged are located immediately below the Gr channels in which the right pupil detection pixels 152R are arranged.

The left pupil detection pixels 151L and the lower pupil detection pixels 154D are arranged alternately in the same columns with three pixels for image picking-up 155 intervening between. The right pupil detection pixels 152R and the upper pupil detection pixels 153U are arranged alternately with three pixels for image picking-up 155 intervening between in the same columns that are different from the columns in which the left pupil detection pixels 151L and the lower pupil detection pixels 154D are arranged.

In this configuration, the positions of the left pupil detection pixels 151L, the right pupil detection pixels 152R, the upper pupil detection pixels 153U, and the lower pupil detection pixels 154D are sifted in both the rows and columns from the positions of the left pupil detection pixels 111L, the right pupil detection pixels 112R, the upper pupil detection pixels 113U, and the lower pupil detection pixels 114D in the first embodiment (shown in FIG. 7).

There are three or more pixels for focus detection in the area defined between the first circle C1 and the second circle C2, though the circles C1 and C2 are not shown in FIG. 13. Therefore, good balance between the image quality and the focus detection performance can be achieved.

Figure 14:
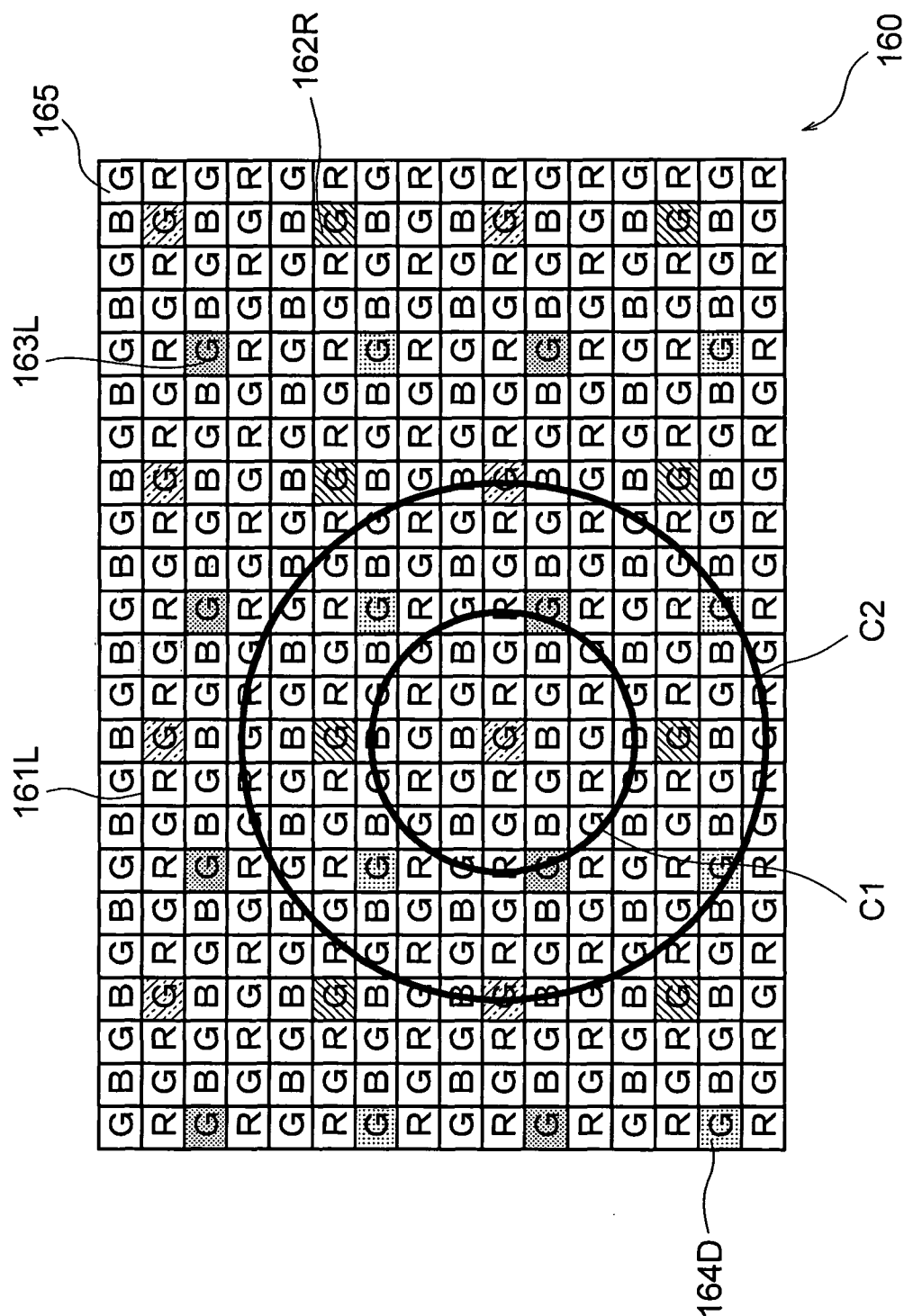
FIG. 14 is a plan view showing the configuration of an image pickup element according to a sixth embodiment.

FIG. 14 is a plan view showing the configuration of an image pickup element according to the sixth embodiment.

The image pickup element 160 according to the sixth embodiment has pixels for image picking-up 165 and pixels for focus detection including left pupil detection pixels 161L, right pupil detection pixels 162R, upper pupil detection pixels 163U, and lower pupil detection pixels 164D.

The left pupil detection pixels 161L are arranged regularly with five pixels for image picking-up 165 intervening between in Gr channels. The right pupil detection pixels 162R are arranged regularly with five pixels for image picking-up 165 intervening between in the second next Gr channels below the Gr channels in which the left pupil detection pixels 161L are arranged. Since the left and right pupil detection pixels are both arranged in the Gr channels, the levels of the signals output therefrom are substantially equal to each other. Therefore, a highly accurate detection can be achieved.

The upper pupil detection pixels 163U are arranged regularly with five pixels for image picking-up 165 intervening between in Gb channels. The lower pupil detection pixels 164D are arranged regularly with five pixels for image picking-up 165 intervening between in the second next Gb channels below the Gb channels in which the upper pupil detection pixels 163U are arranged. Since the upper and lower pupil detection pixels are arranged both in the Gb channels, the levels of the signals output therefrom are substantially equal to each other. Therefore, a highly accurate detection can be achieved.

The Gb channels in which the lower pupil detection pixels 164D are arranged are located immediately below the Gr channels in which the right pupil detection pixels 162R are arranged.

Furthermore, the left pupil detection pixels 161L and the right pupil detection pixels 162R are arranged alternately with three pixels for image picking-up 165 intervening between in the same columns. Therefore, a misregistration in the detection along the vertical direction of an object can be prevented. The upper pupil detection pixels 163U and the lower pupil detection pixels 164D are arranged alternately with three pixels for image picking-up 165 intervening between in the same columns different from the columns in which the left pupil detection pixels 161L and the right pupil detection pixels 162R are arranged.

If the two concentric circles shown in FIG. 8 are applied to FIG. 14, there are eight pixels for focus detection in the area defined between the first circle C1 and the second circle C2. Therefore, good balance between the image quality and the focus detection performance can be achieved.

Figure 15:
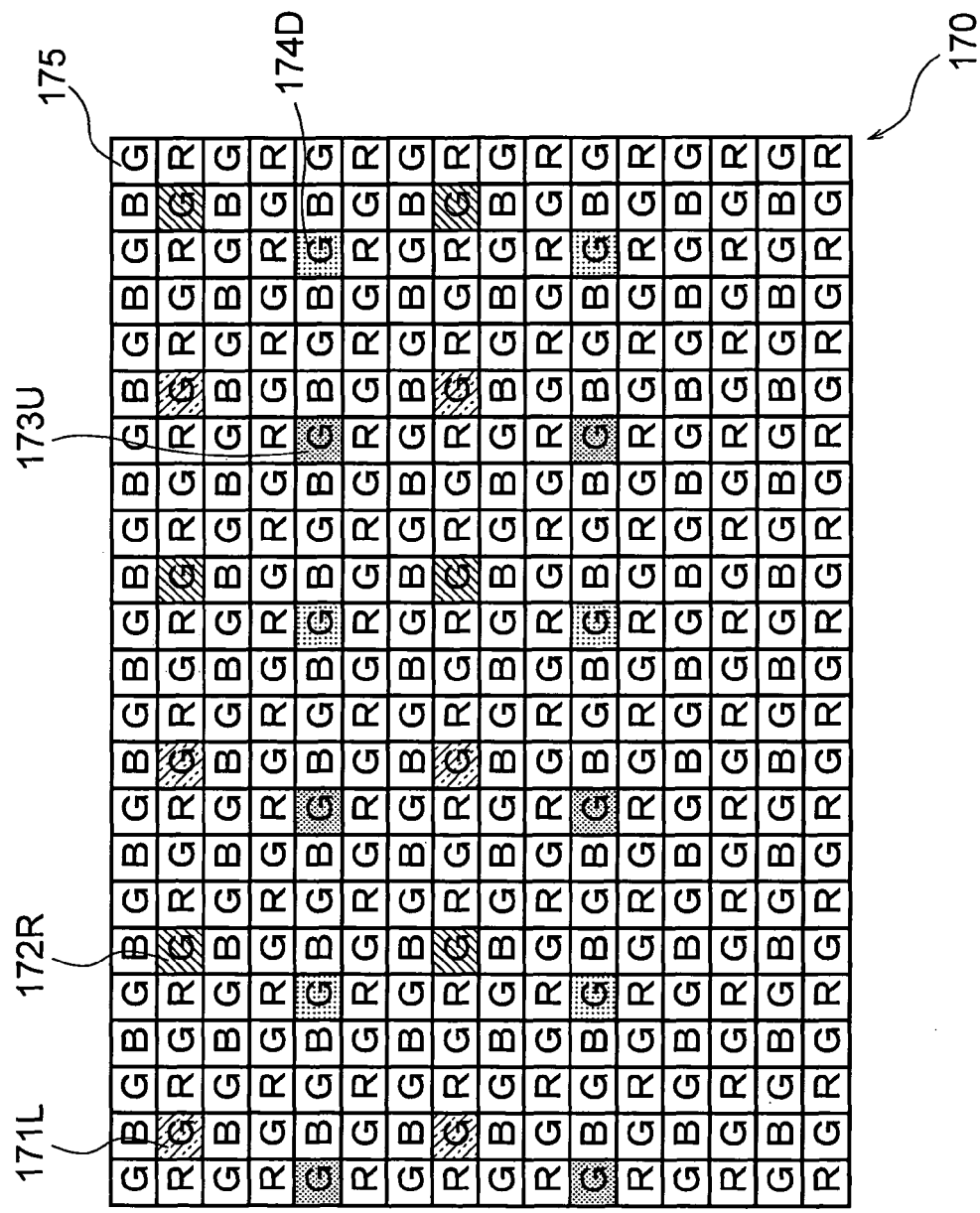
FIG. 15 is a plan view showing the configuration of an image pickup element according to a seventh embodiment.

FIG. 15 is a plan view showing the configuration of an image pickup element according to the seventh embodiment.

The image pickup element 170 according to the fourth embodiment has pixels for image picking-up 175 and pixels for focus detection including left pupil detection pixels 171L, right pupil detection pixels 172R, upper pupil detection pixels 173U, and lower pupil detection pixels 174D.

The left pupil detection pixels 171L and the right pupil detection pixels 172R are arranged alternately with three pixels for image picking-up 175 intervening between in Gr channels. The upper pupil detection pixels 173U and the lower pupil detection pixels 174D are arranged alternately with three pixels for image picking-up 175 intervening between in Gb channels. The Gr channels and the Gb channels in which the pupil detection pixels are arranged are arranged with two rows of channels intervening between.

In one column containing pixels for pupil detection, only one type of pupil detection pixels are arranged regularly with five pixels for picking-up 175 intervening between.

In this configuration, the upper pupil detection pixels 173U and the lower pupil detection pixels 174D are arranged in the same rows. Consequently, a misregistration in the detection along the horizontal direction of an object can be prevented, and the levels of the signals output therefrom are substantially equal to each other. Therefore, a highly accurate detection can be achieved.

In addition, the left pupil detection pixels 171L and the right pupil detection pixels 172R are arranged in the same rows. Therefore, the levels of the signals output therefrom are substantially equal to each other. Thus, a highly accurate detection can be achieved.

There are three or more pixels for focus detection in the area defined between the first circle C1 and the third circle C3, though the circles C1 and C3 are not shown in FIG. 15. Therefore, good balance between the image quality and the focus detection performance can be achieved.

Figure 16:
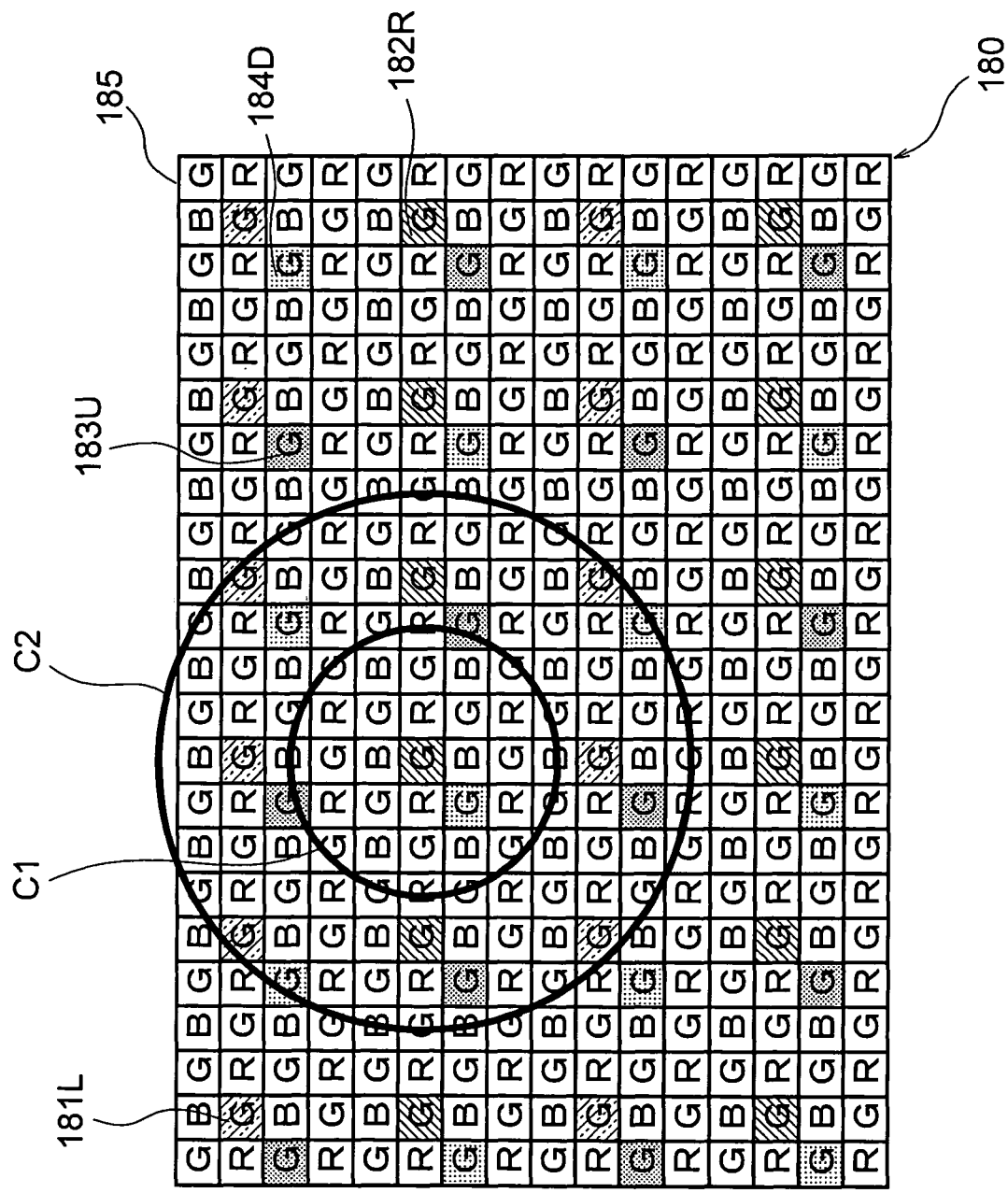
FIG. 16 is a plan view showing the configuration of an image pickup element according to an eighth embodiment.

FIG. 16 is a plan view showing the configuration of an image pickup element according to the eighth embodiment.

The image pickup element 180 according to the eighth embodiment has pixels for image picking-up 185 and pixels for focus detection including left pupil detection pixels 181L, right pupil detection pixels 182R, upper pupil detection pixels 183U, and lower pupil detection pixels 184D.

The left pupil detection pixels 181L are arranged regularly with three pixels for image picking-up 185 intervening between in Gr channels. The right pupil detection pixels 182R are arranged regularly with three pixels for image picking-up 185 intervening between in the second next Gr channels below the Gr channels in which the left pupil detection pixels 181L are arranged.

Furthermore, the left pupil detection pixels 181L and the right pupil detection pixels 182R are arranged in the same columns. Consequently, a misregistration in the detection along the vertical direction of an object can be prevented, and the levels of the signals output therefrom are substantially equal to each other. Therefore, a highly accurate detection can be achieved.

The upper pupil detection pixels 183U and the lower pupil detection pixels 184D are arranged alternately with three pixels for image picking-up 185 intervening between in Gb channels.

The Gb channels in which the upper pupil detection pixels 183U and the lower pupil detection pixels 184D are arranged are located immediately below the Gr channels in which either the left pupil detection pixels 181L or the right pupil detection pixels 182R are arranged. Since the upper pupil detection pixels 183U and the lower pupil detection pixels 184D are arranged in the same rows, a misregistration in the detection along the horizontal direction of an object can be prevented, and the levels of the signals output therefrom are substantially equal to each other. Therefore, a highly accurate detection can be achieved.

The left pupil detection pixels 181L and the right pupil detection pixels 182R are arranged alternately with three pixels for image picking-up 185 intervening between in the same columns. The upper pupil detection pixels 183U and the lower pupil detection pixels 184D are arranged alternately with three pixels for image picking-up 185 intervening between in the same columns different from the columns in which the left pupil detection pixels 181L and the right pupil detection pixels 182R are arranged.

If the two concentric circles shown in FIG. 8 are applied to FIG. 16, there are fifteen pixels for focus detection in the area defined between the first circle C1 and the second circle C2. Therefore, good balance between the image quality and the focus detection performance can be achieved.

Figure 17:
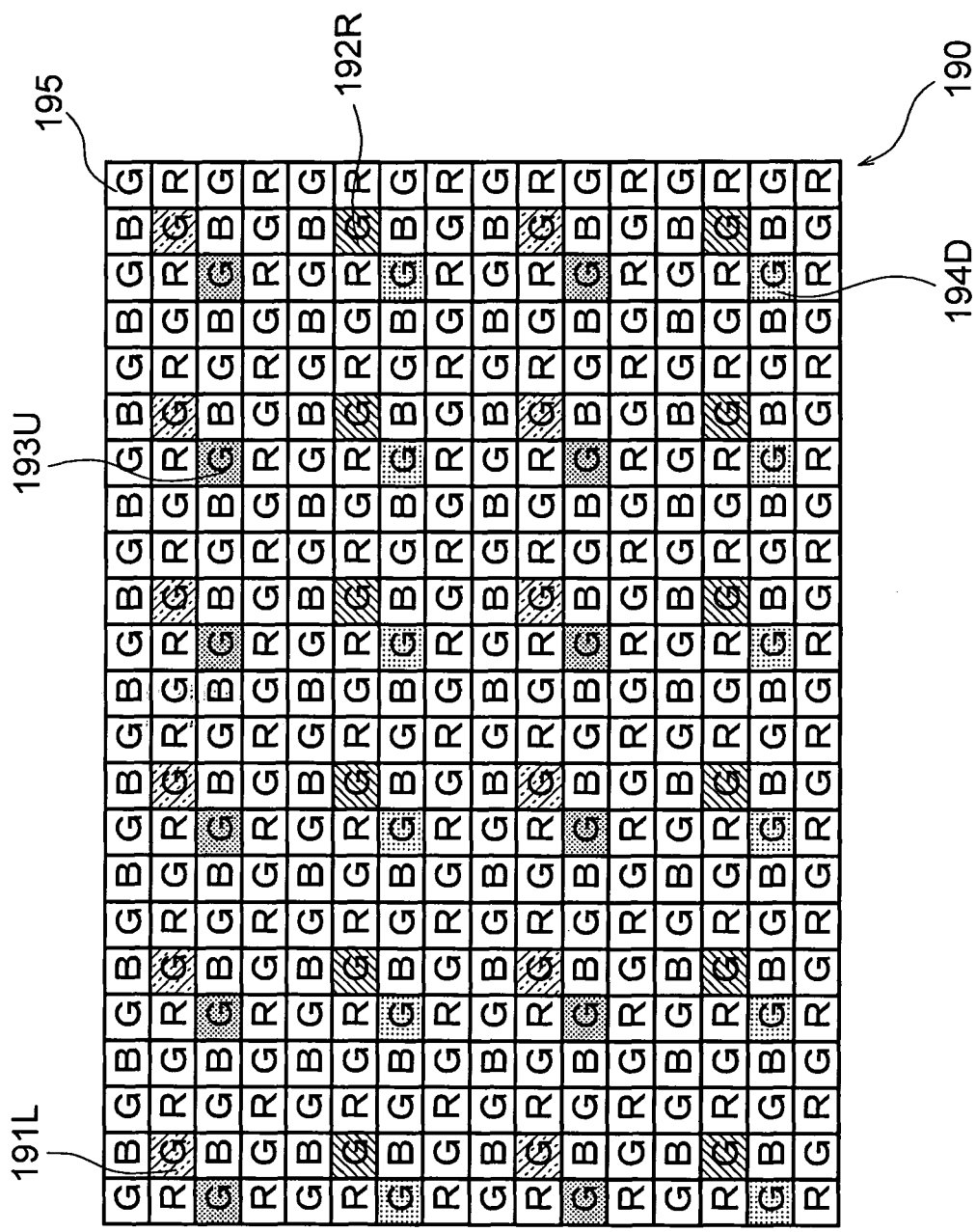
FIG. 17 is a plan view showing the configuration of an image pickup element according to a ninth embodiment.

FIG. 17 is a plan view showing the configuration of an image pickup element according to the ninth embodiment.

The image pickup element 190 according to the ninth embodiment has pixels for image picking-up 195 and pixels for focus detection including left pupil detection pixels 191L, right pupil detection pixels 192R, upper pupil detection pixels 193U, and lower pupil detection pixels 194D.

The left pupil detection pixels 191L are arranged regularly with three pixels for image picking-up 195 intervening between in Gr channels. The right pupil detection pixels 192R are arranged regularly with three pixels for image picking-up 195 intervening between in the second next Gr channels below the Gr channels in which the left pupil detection pixels 191L are arranged.

The upper pupil detection pixels 193U are arranged regularly with three pixels for image picking-up 195 intervening between in Gb channels. The lower pupil detection pixels 194D are arranged regularly with three pixels for image picking-up 195 intervening between in the second next Gb channels below the Gb channels in which the upper pupil detection pixels 193U are arranged. The Gb channels in which the upper pupil detection pixels 193U are arranged are located immediately below the Gr channels in which the left pupil detection pixels 191L are arranged.

With this configuration, the levels of the signals output therefrom are substantially equal to each other. Therefore, a highly accurate detection can be achieved.

The left pupil detection pixels 191L and the right pupil detection pixels 192R are arranged alternately with three pixels for image picking-up 195 intervening between in the same columns. The upper pupil detection pixels 193U and the lower pupil detection pixels 194D are arranged alternately with three pixels for image picking-up 195 intervening between in the same columns different from the columns in which the left pupil detection pixels 191L and the right pupil detection pixels 192R are arranged.

With this configuration, a misregistration in the detection along the vertical direction of an object can be prevented, and the levels of the signals output therefrom are substantially equal to each other. Therefore, a highly accurate detection can be achieved.

In addition, there are three or more pixels for focus detection in the area defined between the first circle C1 and the second circle C2, though the circles C1 and C2 are not shown in FIG. 17. Therefore, good balance between the image quality and the focus detection performance can be achieved.

FIG. 18 is a plan view showing the configuration of an image pickup element according to the tenth embodiment.

The image pickup element 200 according to the tenth embodiment has pixels for image picking-up 205 and pixels for focus detection including left pupil detection pixels 201L, right pupil detection pixels 202R, upper pupil detection pixels 203U, and lower pupil detection pixels 204D.

The left pupil detection pixels 201L are arranged regularly with seven pixels for image picking-up 205 intervening between in Gr channels. The right pupil detection pixels 202R are arranged regularly with seven pixels for image picking-up 205 intervening between in the second next Gr channels below the Gr channels in which the left pupil detection pixels 201L are arranged.

The upper pupil detection pixels 203U are arranged regularly with seven pixels for image picking-up 205 intervening between in Gb channels. The lower pupil detection pixels 204D are arranged regularly with seven pixels for image picking-up 205 intervening between in the Gb channels next to the Gb channels in which the upper pupil detection pixels 203U are arranged.

The Gb channels in which the upper pupil detection pixels 203U are arranged are located immediately below the Gr channels in which the left pupil diction pixels 201L are arranged. The Gr channels in which the right pupil detection pixels 202R are located immediately below the Gb channels in which the lower pupil diction pixels 204D are arranged.

In one column containing pixels for pupil detection, only one type of pupil detection pixels are arranged regularly with seven pixels for image picking-up intervening between.

In this configuration, there are three or more pixels for focus detection in the area defined between the first circle C1 and the second circle C2, though the circles C1 and C2 are not shown in FIG. 18. Therefore, good balance between the image quality and the focus detection performance can be achieved.

In the above described embodiments, the plurality of pixels including the pixels for image picking-up and the pixels for focus detection are arranged in a close-packed tetragonal lattice. However, the pixels may be arranged in a close-packed hexagonal lattice.

In the above described embodiments, the color filters are arranged in a mosaic pattern. However, the color filters may be arranged in a stripe pattern.

In the following, the operation and advantages of the image pickup apparatus and the camera according to the embodiments will be described.

The image pickup apparatus according to the embodiments comprises a plurality of pixels each having a photoelectric converter that converts an optical image formed by a taking optical system into an electrical signal, a plurality of color filters provided on the plurality of pixels respectively, and an image pickup element in which the plurality of pixels are arranged two-dimensionally, wherein at least some of the pixels on which color filters that give the largest weight to a brightness signal or color filters that have the highest transmittance among the plurality of color filters are provided are pixels for focus detection that are designed in such a way that the direction of incidence of light beams incident thereon is restricted, the pixels other than the pixels for focus detection are pixels for image picking-up that are designed in such a way that the degree of restriction placed on light beams incident thereon is smaller than that placed on light beams incident on the pixels for focus detection, the pixels for focus detection output at least a signal for ranging, the pixels for image picking-up output at least a signal for an image, and there are at least three pixels for focus detection in an area defined between a circle having its center at the center of any one of the pixels for focus detection and having a radius equal to 3.1 times the pixel pitch and a circle having its center at the center of the aforementioned any one of the pixels for focus detection and having a radius equal to 5.9 times the pixel pitch.

(1) The more densely the pixels for focus detection are distributed, the higher the focus detection performance is, but the lower the image quality is deteriorated. (2) The more sparsely the pixels for focus detection are distributed, the lower the focus detection performance is, but the higher the image quality is.

(3) When it comes to contribution to the image quality, the quality of the signals output from the pixels for focus detection are lower than the quality of the signals output from the pixels for image picking-up. Therefore, it is necessary to perform, for example, pixel interpolation using the signals output from the pixels for image picking up in the neighborhood the pixels for focus detection in order to improve the image quality. To achieve this pixel interpolation, it is necessary that there are a certain number of pixels for image picking-up in the neighborhood the pixel for focus detection.

In the image pickup apparatus according to the embodiments, since the pixels for focus detection are arranged as shown in the embodiments, good balance among the above described issues (1), (2), and (3) is achieved.

Conventional image pickup apparatuses are categorized mainly into the following two types in terms of the scheme of obtaining ranging information:
(a) apparatuses not having optical path changing means; and
(b) apparatuses having optical path changing means.

The apparatuses (a), which are typically compact cameras, have no optical path changing means and can have a small overall system size (in particular with respect to the thickness) accordingly. The apparatuses (b), which are typically single-lens reflex cameras, have optical path changing means (such as a quick return mirror), leading to an increase in the size of the overall system.

The image pickup apparatus according to the embodiment does not require the optical path changing means used to obtain ranging information. Therefore, a reduction in the overall size of the system can be achieved.

The pixels for focus detection can output a signal for ranging. Since color filters that give the largest weight to a brightness signal are provided on the pixels for focus detection, the following advantages are achieved.
(i) Since the pixels for focus detection receive the light beams that have transmitted through the color filters, they can also output a signal for image picking-up.
(ii) Since the color filters that give the largest weight to a brightness signal have a spectral transmission band wider than those of the other color filters, the displacement of the image plane with respect to the best image plane for the white light is small.
(iii) Since the color filters that give the largest weight to a brightness signal have a spectral transmission band wider than those of the other color filters, the largest light quantity can be obtained. This is advantageous for ranging and improvement in the image quality.

With the above described advantages, an image pickup apparatus having good focus detection performance with small deterioration in the image quality can be achieved.

In the image pickup apparatus according to the embodiments, it is preferred that at least some of the pixels on which color filters that give the largest weight to the brightness signal among the plurality of color filters are provided be pixels for focus detection that are designed in such a way that the direction of incidence of light beams incident thereon is restricted, that the pixels other than the pixels for focus detection be pixels for image picking-up that are designed in such a way that the degree of restriction placed on light beams incident thereon is smaller than that placed on light beams incident on the pixels for focus detection, that the pixels for focus detection output a signal for ranging and for an image, and that the pixels for image picking-up output a signal for an image.

In the image pickup apparatus according to the embodiments, it is preferred that the photoelectric converters of the pixels for focus detection be adapted to receive light beams transmitted through different regions of a pupil of the taking lens, that there be plurality of the different regions of the pupil, and that a focus state of the taking lens be detected by measuring the phase difference of a first image signal obtained from an output of a photoelectric converter that receives light beams transmitted through one of the different regions of the pupil and a second image signal obtained from an output of a photoelectric converter that receives light beams transmitted through another one of the different regions of the pupil.

Here, the phase difference refers to a relative positional relationship between the two image signals.

Most of conventional image pickup apparatuses employ one of the following two ranging methods:
(1) a contrast method; and
(2) a phase difference method.

In the case of the contrast method (1), ranging is performed by what is called a hill-climbing, in which a contrast value is estimated while changing the focusing state. In this method, it takes time to achieve an in-focus state. In the case of the phase difference method (2), the time taken to achieve an in-focus state is short, but it is necessary to provide a dedicated AF optical system and optical path switching means. This leads to an increase in the overall size of the system.

In the image pickup apparatus according to the embodiments, as described above, the photoelectric converters of the pixels for focus detection are adapted to receive light beams transmitted through different regions of the pupil of the taking lens, there are plurality of the different regions of the pupil, and a focus state of the taking lens is detected by measuring a phase difference of a first image signal obtained from an output of a photoelectric converter that receives light beams transmitted through one of the different regions of the pupil and a second image signal obtained from an output of a photoelectric converter that receives light beams transmitted through another one of the different regions of the pupil. Thus, an image pickup apparatus having a good focus detection performance and requiring only a short period of time for focusing can be achieved.

In the image pickup apparatus according to the embodiments, it is preferred that there be four or more different regions of the pupil, and two or more phase difference data be obtained.

Since focus detection is performed along two direction of an object, the focus detection performance is improved irrespective of the object as compared to the case in which focus detection is performed along one direction of an object. For example, if the pupil is divided both vertically and horizontally, detection along the horizontal direction of an object can be performed, and detection performance can be improved as compared to the case in which the pupil is divided only vertically.

In the image pickup apparatus according to the embodiments, it is preferred that the plurality of color filters have a transmitting wavelength range covering at least a portion of the visible wavelength range, and there be at least three types of color filters having different transmitting wavelength ranges.

In the image pickup apparatus according to the embodiments, it is preferred that if the color filters that have a transmission characteristic that transmits light of shortest wavelengths among the different transmission characteristics are referred to as B (blue) filters, the color filters that have a transmission characteristic that transmits light of longest wavelengths among the different transmission characteristics are referred to as R (red) filters, and color filters that have the other transmission characteristic are referred to as G (green) filters, the color filters that give the largest weight to the brightness signal be G filters.

In the image pickup apparatus according to the embodiments, it is preferred that at least one type of the pixels for focus detection be arranged as pixels that divide a pupil vertically, and the pixels that divide the pupil vertically be arranged in a same column.

In conventional pixel arrangements, a left pupil detection pixel(s) and a right pupil detection pixel(s) are not arranged in the same column, and therefore it is impossible to accurately detect the same vertical line in an object. On the other hand, in the image pickup apparatus according to the embodiments, since the pixels for focus detection are arranged sparsely, left pupil detection pixels and right pupil detection pixels can be arranged in the same column. Therefore, the same vertical line of an object can be detected accurately, and the focus detection performance can be improved (see FIG. 10).

In the arrangement shown in FIG. 10, since the left pupil detection pixel 121L and the right pupil detection pixel 122R are arranged in the same column, the phase difference along the vertical direction of an object can be measured more accurately than in the case in which the right pupil detection pixel 122R and the left pupil detection pixel 121L2 are arranged in the same row. Consequently, an improvement in the phase difference detection performance can be achieved. Generally, structures having vertical lines are more usually found in the natural world than structures having horizontal lines. Therefore, the arrangement that measures the phase difference along the vertical direction more accurately than the phase difference along the horizontal direction is preferred.

In the image pickup apparatus according to the embodiments, it is preferred that in the pixel area there be no pixel for focus detection other than any one of pixels for focus detection on a line that passes through the center of the aforementioned any one of pixels for focus detection and extends in the column direction or the row direction.

In the image pickup apparatus according to the embodiments, when a fiducial point is set at the center of the aforementioned any one of pixels for focus detection, it is preferred that there be no pixel for focus detection other than the aforementioned any one of pixels for focus detection inside the circle having its center at the fiducial point and having a radius equal to 3.1 times the pixel pitch.

The camera according to the embodiment comprises an image pickup apparatus according to any one of above described embodiments, an image pickup optical system that forms an optical image in the image pickup apparatus, and an image processing unit that processes the image data obtained by picking up an image formed by the image pickup optical system by the image pickup apparatus and outputs image data representing an image of which the shape has been changed.

As described above, the image pickup apparatus and the camera according to the present invention can suitably be applied to an image pickup apparatus and a camera that is required to have high focus detection performance without a significant deterioration in the image quality.

The present invention can advantageously provide an image pickup apparatus having high focus detection performance without a significant deterioration in the image quality. Furthermore, the image pickup apparatus and the camera according to the present invention detect the phase difference along two directions. This further improves the focus detection performance.

What is claimed is:

1. An image pickup apparatus comprising:
a plurality of pixels each having a photoelectric converter that converts an optical image formed by an image pickup optical system into an electrical signal;
a plurality of color filters provided on the plurality of pixels respectively; and
an image pickup element in which the plurality of pixels are arranged two-dimensionally, wherein
at least some of the pixels on which color filters that give the largest weight to a brightness signal or color filters that have the highest transmittance among the plurality of color filters are provided are pixels for focus detection that are designed in such away that the direction of incidence of light beams incident thereon is restricted,
the pixels other than the pixels for focus detection are pixels for image picking-up that are designed in such a way that the degree of restriction placed on light beams incident thereon is smaller than that placed on light beams incident on the pixels for focus detection,
the pixels for focus detection output at least a signal for ranging, the pixels for image picking-up output at least a signal for an image, and there are at least three pixels for focus detection in an area defined between a circle having its center at the center of any one of the pixels for focus detection and having a radius equal to 3.1 times the pixel pitch and a circle having its center at the center of the aforementioned any one of the pixels for focus detection and having a radius equal to 5.9 times the pixel pitch.

2. The image pickup apparatus according to claim 1, wherein at least some of the pixels on which color filters that give the largest weight to the brightness signal among the plurality of color filters are provided are pixels for focus detection that are designed in such a way that the direction of incidence of light beams incident thereon is restricted, the pixels other than the pixels for focus detection are pixels for image picking-up that are designed in such a way that the degree of restriction placed on light beams incident thereon is smaller than that placed on light beams incident on the pixels for focus detection, the pixels for focus detection output a signals for ranging and for an image, and the pixels for image picking-up output a signal for an image.

3. The image pickup apparatus according to claim 1, wherein each of the photoelectric converters of the pixels for focus detection are adapted to receive light beams transmitted through different regions of a pupil of a taking lens, there are plurality of the different regions of the pupil, and a focus state of the taking lens is detected by measuring a phase difference of a first image signal obtained from an output of a photoelectric converter that receives light beams transmitted through one of the different regions of the pupil and a second image signal obtained from an output of a photoelectric converter that receives light beams transmitted through another one of the different regions of the pupil.

4. The image pickup apparatus according to claim 1, wherein there are four or more different regions of the pupil, and two or more phase difference data are obtained.

5. The image pickup apparatus according to claim 1, wherein the plurality of color filters have a transmitting wavelength range covering at least a portion of the visible wavelength range, and there are at least three types of color filters having different transmitting wavelength ranges.

6. The image pickup apparatus according to claim 5, wherein if the color filters that have a transmission characteristic that transmits light of shortest wavelengths among the different transmission characteristics are referred to as B filters, the color filters that have a transmission characteristic that transmits light of longest wavelengths among the different transmission characteristics are referred to as R filters, and color filters that have the other transmission characteristic are referred to as G filters, then the color filters that give the largest weight to the brightness signal are G filters.

7. The image pickup apparatus according to claim 3, wherein at least one type of the pixels for focus detection are arranged as pixels that divide a pupil vertically, and the pixels that divides the pupil vertically are arranged in a same column.

8. The image pickup apparatus according to claim 1, wherein in the pixel area, there is no pixel for focus detection other than the aforementioned any one of pixels for focus detection on a line that passes through the center of the aforementioned any one of pixels for focus detection and extends in a column direction and a row direction.

9. The image pickup apparatus according to claim 1, wherein there is no pixel for focus detection other than the aforementioned any one of pixels for focus detection inside the circle having a radius equal to 3.1 times the pixel pitch.

10. A camera comprising:

an image pickup apparatus according to claim 1; and an image pickup optical system that forms an optical image in the image pickup apparatus.

* * * * *